(12) United States Patent
Fujie et al.

(10) Patent No.: US 6,432,608 B1
(45) Date of Patent: Aug. 13, 2002

(54) RESIST COMPOSITION

(75) Inventors: Hirotoshi Fujie; Tsuneaki Maesawa; Yasuyoshi Mori, all of Kawagoe (JP)

(73) Assignee: Wako Pure Chemical Industries, Ltd., Osaka (JP)

( * ) Notice: Subject to any disclaimer, the term of this patent is extended or adjusted under 35 U.S.C. 154(b) by 0 days.

(21) Appl. No.: 09/589,770

(22) Filed: Jun. 9, 2000

(30) Foreign Application Priority Data

Jun. 9, 1999 (JP) ............................................ 11-162540
Sep. 13, 1999 (JP) ............................................ 11-259338

(51) Int. Cl.$^7$ ..................... G03F 7/004; C08F 220/12
(52) U.S. Cl. .................... 430/270.1; 522/150; 526/334; 526/348.2; 526/266; 526/297; 526/326; 526/319; 526/329.2
(58) Field of Search ...................... 430/270.1; 526/313, 526/319, 329.2, 334, 348.2, 297, 326; 522/150

(56) References Cited

U.S. PATENT DOCUMENTS 6,001,739 A * 12/1999 Konishi ...................... 438/692

FOREIGN PATENT DOCUMENTS

| EP | 588544 | * | 3/1994 | ........... G03F/7/039 |
| EP | 0789279 A | | 8/1997 | |

* cited by examiner

*Primary Examiner*—Rosemary Ashton
(74) *Attorney, Agent, or Firm*—Armstrong, Westerman & Hattori, LLP

(57) ABSTRACT

This invention relates to a polymer capable of forming an ultra-fine pattern with excellent rectangular shape in a silylated surface resolution process using a chemically amplified type resist composition as single layer or the most upper layer among multiple layers and to a resist composition using the polymer.

The said polymer and resist composition are useful in a silylated surface resolution process, and by conducting the silylated surface resolution process using the said resist composition, contrast of silylation becomes higher and it becomes possible to obtain ultra-fine pattern regardless of the kind of exposure energy.

23 Claims, 6 Drawing Sheets

0.16μm L&S 0.10 μm L & S 0.14μm L&S 0.05 μm L & S 0.05μm L & S

RESIST COMPOSITION

BACKGROUND OF INVENTION

The present invention relates to a polymer useful as an ingredient of a resist composition for a surface resolution process used in manufacturing semiconductor elements, etc. and to a resist composition using the polymer.

In compliance with the requirements for ultra-fine processing according to high integration of semiconductor devices, the light source of exposure used in lithography processes has recently been changed from i line beams (365 nm) to one having shorter wavelength such as KrF excimer laser (248 nm) and ArF excimer laser (193 nm) and further to $F_2$ excimer laser (157 nm) and EB (electron beams).

As the change of the light source of exposure, the main current of the pattern formation has been shifted to one using so-called chemically amplified type resist composition wherein a polymer is chemically changed to alkali-soluble one by the act of an acid as a catalyst, which is generated from a photo-sensitive compound, followed by developing by an alkaline developing solution. In this pattern formation, because of forming the pattern with the use of an alkaline developing solution, there has been recognized such a serious problem in accordance with the tendency to scaling-down as collapse of the pattern and rounding of pattern top shape by the surface tension upon evaporation of water remaining among the resist patterns, which result in failing to give the desired shape of ultra-fine pattern.

In order to dissolve this kind of problem, there has been studied a surface resolution process comprising silylating a chemically changed surface of a resist in place of using an alkaline developing solution and then dry-developing by oxygen plasma etching technology (hereinafter abbreviated as silylated surface resolution process). However, there have been found many problems in conducting this silylated surface resolution process with the use of the so far known chemically amplified type resist compositions. Namely, for instance, when poly(p-tert-butoxycarbonyloxystyrene) disclosed in U.S. Pat. No. 4,552,833, poly(p-tert-butoxycarbonyloxystyrene/N-methylmaleimide) disclosed in EPC Publication No. 0264908, poly(p-tert-butoxystyrene/methyl methacrylate) disclosed in EPC Publication No. 0284864, poly(p-tert-butoxystyrene/fumaronitrile) disclosed in Japanese Patent Publication-Kokai- No. 223858/1991, etc. are used in this process as a polymer component, there is observed such a problem that those polymers are hardly liable to the chemical change by the acid generated by exposure to cause mere insufficient chemical change in the exposed area and insufficient silylation reaction in the next process step, which results in failing to give high contrast. On the other hand, when poly[p-(1-ethoxyethoxystyrene)] disclosed in Japanese Patent Publication-Kokai- No. 171262/1996 which is easily liable to chemical change by the acid is used in this process, there have been observed such problems that silylation is occurred even in a part of unexposed areas by the chemical change to fail to give high contrast and that no sufficient pattern formation is realized because of low heat resistance of the polymer itself. Further, in case of polymers containing many silylation liable monomer units, for example, the monomer units derived from hydroxystyrene (e.g. poly[p-(1-ethoxyethoxystyrene)/p-hydroxystyrene]) such as the resist composition disclosed in Japnese Patent Publication-Kokai- No. 273934/1994 and No. 24682/1993, there is found such a problem that silylation is occurred also in unexposed areas to fail to give the necessary contrast. Still further, in a resist composition using a polymer originally containing Si in its molecule such as poly(p-trimethylsilyloxystyrene/p-hydroxystyrene) disclosed in J. C. McFarland et al., Proc. SPIE, 920, 162 (1988), there is also found such a problem that no sufficient contrast against unexposed areas by the silylation is observed to fail to form the desired ultra-fine pattern. Particularly, in the lithography process using ArF excimer laser (193 nm) as the light source of exposure, when the polymer constructed from only the styrene type monomer units [e.g. p-(1-ethoxyethoxystyrene), p-tert-butoxycarbonyloxystyrene, styrene, etc.] is used, there is observed such a problem that the polymer have very low transmissivity against ArF excimer laser to limit the part liable to chemical change to just one small portion of the surface of a resist and to cause nonuniform chemical change in the edge of pattern having lower exposure than the center, which results in nonuniform silylation reaction. For the reasons, in case of conducting a etching process after silylation, there has been recognized such a problem that the edge of pattern is nonuniform etched to make larger the edge roughness.

Now therefore, development of a polymer capable of giving ultra-fine pattern with excellent rectangular shape by the silylated surface resolution process and development of a resist composition using the polymer have strongly been desired at the present stage.

SUMMARY OF INVENTION

The present invention has been accomplished taking the above mentioned situation into consideration, and its object is to provide a polymer capable of forming an ultra-fine pattern with excellent rectangular shape in a silylated surface resolution process using a chemically amplified type resist composition as a single layer or the most upper layer among multiple layers and to a resist composition using the polymer.

Namely, the present inventors have extensively studied in order to dissolve the problems mentioned above observed in a silylated surface resolution process using known resist compositions to arrive at the finding that the use of a resist composition containing the polymers shown by the general formula [1] can give high contrast between the exposed areas and unexposed areas to obtain heat resistible rectangular ultra-fine pattern, and the present invention has been accomplished on the basis of this finding.

The present invention comprises the following features in order to attain the above-mentioned object.

(1) A polymer, which is shown by the following general formula [1]

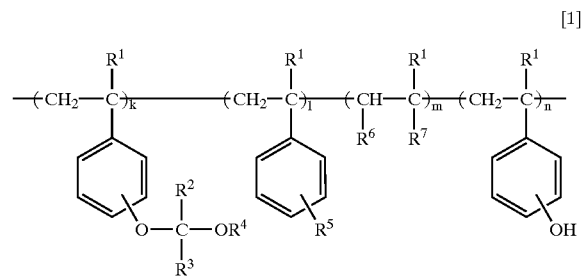

[wherein $R^1$ is a hydrogen atom or a methyl group, $R^2$ and $R^3$ are each independently a hydrogen atom or a straight chained or branched alkyl group having 1 to 6 carbon atoms (excepting a case where both of $R^2$ and $R^3$ are hydrogen atoms), $R^4$ is a straight chained, branched or cyclic alkyl group having 1 to 6 carbon atoms, an aralkyl group or a phenyl group, and $R^2$ and $R^3$, $R^2$ and $R^4$ or $R^3$ and $R^4$ may form together a ring, respectively, $R^5$ is a hydrogen atom, a straight chained, branched or cyclic alkyl group having 1 to 6 carbon atoms, a straight chained, branched or cyclic alkoxy group having 1 to 6 carbon atoms, a tert-butoxycarbonyloxy group, a tetrahydropyranyloxy group, an acetyloxy group or a group of —OCH$_2$COOC(CH$_3$)$_3$, $R^6$ is a hydrogen atom or a cyano group, $R^7$ is a group of —COOR$^8$ (in which $R^8$ is a straight chained, branched or cyclic alkyl group having 1 to 6 carbon atoms or a bridged alicyclic hydrocarbon group having 7 to 12 carbon atoms), a cyano group or a group shown by the following general formula [8]

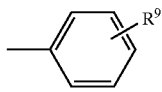

(wherein $R^9$ is a hydrogen atom, a straight chained, branched or cyclic alkyl group having 1 to 6 carbon atoms or a straight chained, branched or cyclic alkoxy group having 1 to 6 carbon atoms), and $R^6$ and $R^7$ may form together a group of —CO—O—CO— or —CO—NR$^{10}$—CO— (wherein $R^{10}$ is a hydrogen atom, a straight chained, branched or cyclic alkyl group having 1 to 6 carbon atoms or a straight chained, branched or cyclic alkoxy group having 1 to 6 carbon atoms), k is a positive integer, l, m and n are each independently 0 or a positive integer (providing $0.1 \leq k/(k+l+m+n) \leq 0.9$, $0 \leq l/(k+l+m+n) \leq 0.9$, $0 \leq m/(k+l+m+n) \leq \leq 0.8$, and $0 \leq n/(k+l+m+n) < 0.1$, providing that a case where l and m are both 0 is excluded)].

(2) A polymer for a resist composition, which comprises the polymer mentioned as the above (1).

(3) A resist composition, which comprises the polymer mentioned as the above (1).

(4) A resist composition comprising a polymer shown by the following general formula [1], a compound capable of generating an acid by irradiation with actinic radiation and a solvent capable of dissolving them

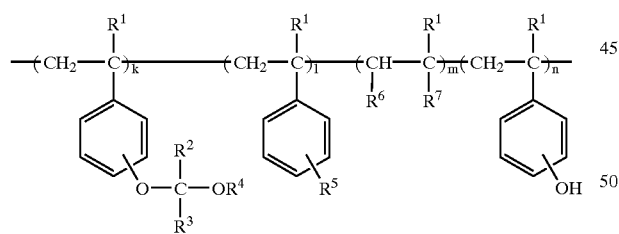

[wherein $R^1$ is a hydrogen atom or a methyl group, $R^2$ and $R^3$ are each independently a hydrogen atom or a straight chained or branched alkyl group having 1 to 6 carbon atoms (excepting a case where both of $R^2$ and $R^3$ are hydrogen atoms), $R^4$ is a straight chained, branched or cyclic alkyl group having 1 to 6 carbon atoms, an aralkyl group or a phenyl group, and $R^2$ and $R^3$, $R^2$ and $R^4$ or $R^3$ and $R^4$ may form together a ring, respectively, $R^5$ is a hydrogen atom, a straight chained, branched or cyclic alkyl group having 1 to 6 carbon atoms, a straight chained, branched or cyclic alkoxy group having 1 to 6 carbon atoms, a tert-butoxycarbonyloxy group, a tetrahydropyranyloxy group, an acetyloxy group or a group of —OCH$_2$COOC(CH$_3$)$_3$, $R^6$ is a hydrogen atom or a cyano group, $R^7$ is a group of —COOR$^8$ (in which $R^8$ is a straight chained, branched or cyclic alkyl group having 1 to 6 carbon atoms or a bridged alicyclic hydrocarbon group having 7 to 12 carbon atoms), a cyano group or a group shown by the following general formula [8]

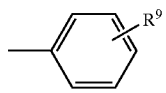

(wherein $R^9$ is a hydrogen atom, a straight chained, branched or cyclic alkyl group having 1 to 6 carbon atoms or a straight chained, branched or cyclic alkoxy group having 1 to 6 carbon atoms), and $R^6$ and $R^7$ may form together a group of —CO—O—CO— or —CO—NR$^{10}$—CO— (wherein $R^{10}$ is a hydrogen atom, a straight chained, branched or cyclic alkyl group having 1 to 6 carbon atoms or a straight chained, branched or cyclic alkoxy group having 1 to 6 carbon atoms), k is a positive integer, l, m and n are each independently 0 or a positive integer (providing $0.1 \leq k/(k+l+m+n) \leq 0.9$, $0 \leq l/(k+l+m+n) \leq 0.9$, $0 \leq m/(k+l+m+n) \leq 0.8$, and $0 \leq n/(k+l+m+n) < 0.1$, providing that a case where l and m are both 0 is excluded)].

DESCRIPTION OF THE PREFERRED EMBODIMENTS

Figure 1:
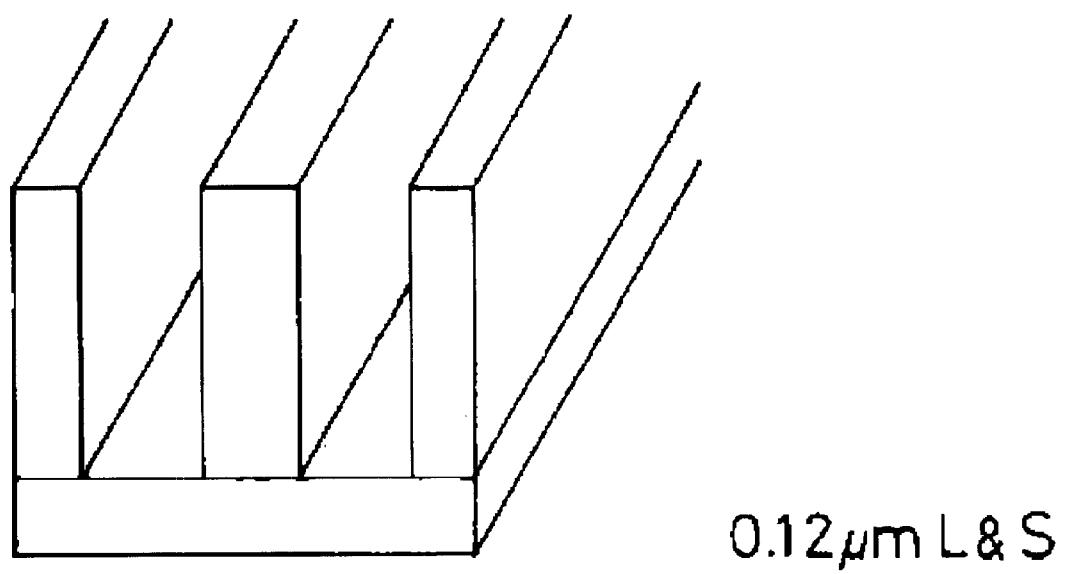
FIG. 1 is a cross-sectional view of the good shape of L & S pattern form obtained by using a resist composition wherein the polymer of the present invention is used.

The polymer used in the present invention is one containing, as the essential constitutional units, the monomer units shown by the following general formula [2], and [3] and/or [4], and further if necessary the monomer unit shown by the general formula [5], and more specifically there can be exemplified by a combination of the monomer unit of the general formula [2] and that of the general formula [3]; a combination of the monomer unit of the general formula [2] and that of the general formula [4]; a combination of the monomer unit of the general formula [2], that of the general formula [3] and that of the general formula [4]; a combination of the monomer unit of the general formula [2], that of the general formula [3] and that of the general formula [5]; a combination of the monomer unit of the general formula [2], that of the general formula

[4] and that of the general formula [5] and a combination of the monomer unit of the general formula [2], that of the general formula [3], that of the general formula [4] and that of the general formula [5].

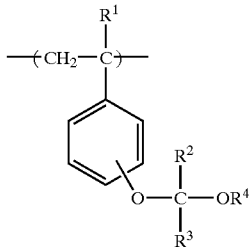
[2]

(wherein $R^1$, $R^2$, $R^3$ and $R^4$ have the same meaning as above)

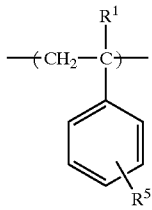
[3]

(wherein $R^1$ and $R^1$ have the same meaning as above)

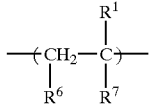
[4]

(wherein $R^1$, $R^6$ and $R^7$ have the same meaning as above)

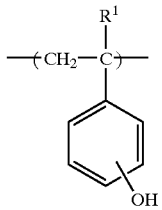
[5]

(wherein $R^1$ has the same meaning as above).

Among those polymers, the polymers shown by the following general formula [1'], [6], [6'], [6"], [6'''], [6''''], [7], [7'], [17] and [17"] are preferable and the general formula [6], [6''''], [7], [7'], [17] and [17'] are particularly preferable because a residue is hardly remained on a substrate after pattern formation in those resins. (in other words, the resist composition on the substrate surface can almost completely be removed after etching). When KrF excimer laser are used as the light source, in order to give high resolution, it is preferable that the constitution ratio of the monomer units shown by the general formula [2] in the above mentioned polymers is 10% to 70% and the constitution ratio of the monomer units shown by the general formula [4] is 70% or lower, preferably 60% or lower. Further, when ArF excimer laser are used as the light source, in order to give high transmissivity against ArF excimer laser, it is preferable that the constitution ratio of the monomer units shown by the general formula [4] in the above mentioned polymers is 30% to 70%, preferably 40% to 60%. Among those preferable polymers, the polymers shown by the following general formula [17] are particularly preferable because a residue is hardly remained on a substrate after pattern formation in those polymers (in other words, the resist composition on the substrate surface can almost completely be removed after etching) and the polymers having high transmissivity against ArF excimer laser are easily obtained. For the purpose of the mentioned above, the constitution ratio of the monomer units shown by the general formula [4] in the polymer shown by the general formulas [6] and [17] is 30% to 70%, preferably 40% to 60%.

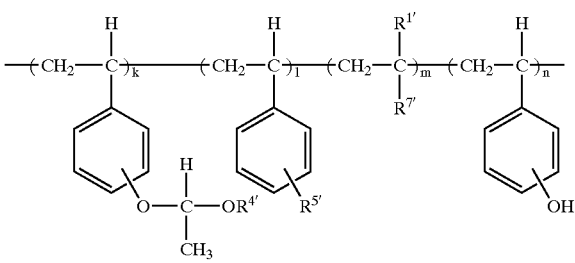
[1']

[wherein $R^{4'}$ is a methyl group or an ethyl group, $R^{5'}$ is a hydrogen atom, a t-butoxy group, a t-butoxycarbonyloxy group or a tetrahydropyranyloxy group, $R^{1'}$ is a hydrogen atom or a methyl group, $R^{7'}$ is a methoxycarbonyl group, a cyclohexyloxycarbony group or an isobornyloxycarbonyl group, and k, l, m and n have the same meaning as above].

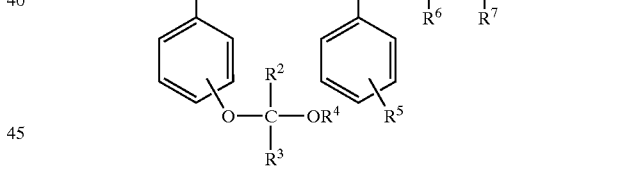
[6]

[wherein m' is a positive integer, and $R^1$, $R^2$, $R^3$, $R^4$, $R^5$, $R^6$, $R^7$, k and l have the same meaning as above.].

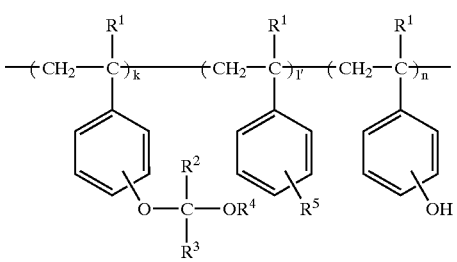
[6']

[wherein l' is a positive integer, and $R^1$, $R^2$, $R^3$, $R^4$, $R^5$, k and n have the same meaning as above].

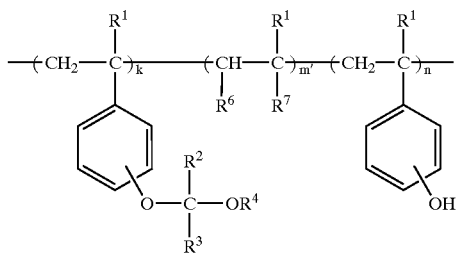

[6″]

[wherein $R^1$, $R^2$, $R^3$, $R^4$, $R^6$, $R^7$, k, m' and n have the same meaning as above].

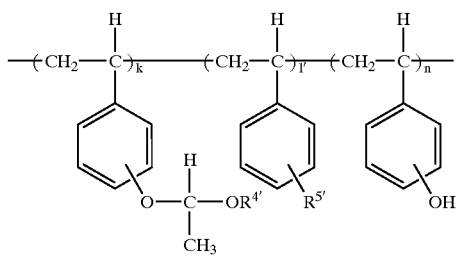

[6‴]

[wherein $R^{5'}$ is a hydrogen atom, a t-butoxy group, a t-butoxycarbonyloxy group or a tetrahydropyranyloxy group, and k, l' and n have the same meaning as above].

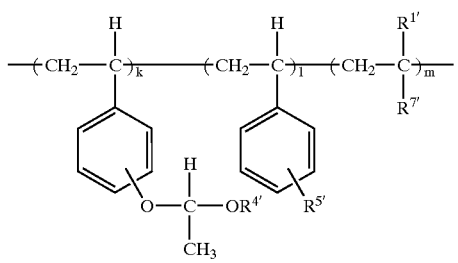

[6″″]

[wherein $R^{4'}$ is a methyl group or an ethyl group, $R^{5'}$ is a hydrogen atom, a t-butoxy group, a t-butoxycarbonyloxy group or a tetrahydropyranyloxy group, $R^{1'}$ is a hydrogen atom or a methyl group, $R^{7'}$ is a methoxycarbonyl group, a cyclohexyloxycarbony group or an isobornyloxycarbonyl group, and k and m' have the same meaning as above].

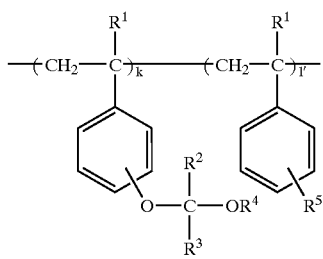

[7]

[wherein $R^1$, $R^2$, $R^3$, $R^4$, $R^5$, k and l' have the same meaning as above, providing $0.1 \leq k/(k+l') \leq 0.9$].

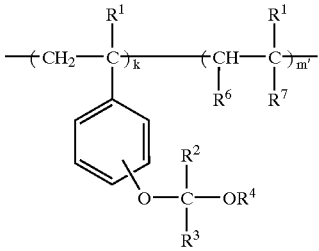

[17]

[wherein $R^1$, $R^2$, $R^3$, $R^4$, $R^6$, $R^7$, k and m' have the same meaning as above, providing $0.2 \leq k/(k+m') \leq 0.9$, $0.1 \leq m'/(k+m') \leq 0.8$].

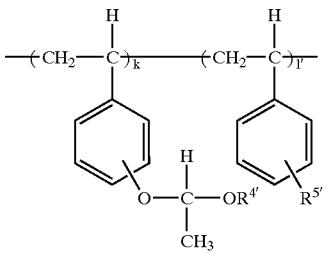

[7']

[wherein $R^{4'}$ is a methyl group or an ethyl group, $R^{5'}$ is a hydrogen atom, a t-butoxy group, a t-butoxycarbonyloxy group or a tetrahydropyranyloxy group, and k and l' have the same meaning as above].

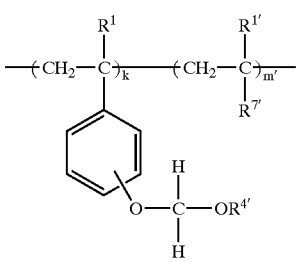

[17']

[wherein $R^{4'}$ is a methyl group or an ethyl group, $R^{1'}$ is a hydrogen atom or a methyl group, $R^{7'}$ is a methoxycarbonyl group, a cyclohexyloxycarbony group or an isobornyloxycarbonyl group, and k and m' have the same meaning as above].

In the general formula [1], [2], [3], [4], [6], [6'], [6″], [7] and [17], the straight chained, branched or cyclic alkyl group having 1 to 6 carbon atoms, which is shown by $R^2$, $R^3$, $R^4$, $R^5$, $R^8$ when $R^7$ is —$COOR^8$, $R^9$ when $R^7$ is a group shown by the general formula [8] or $R^{10}$ when $R^6$ and $R^7$ form together a group of —CO—$NR^{10}$—CO— includes a methyl group, an ethyl group, an n-propyl group, an isopropyl group, a cyclopropyl group, an n-butyl group, an isobutyl group, a sec-butyl group, a tert-butyl group, an n-pentyl group, an isopentyl group, a cyclopentyl group, an n-hexyl group, a cyclohexyl group, etc. In the general formula [1], [3], [4], [6], [6'], [6″], [7] and [17], the straight straight chained, branched or cyclic alkoxy group having 1 to 6 carbon atoms shown by $R^5$, $R^9$ when $R^7$ is a group shown by the general formula [8] or $R^{10}$ when $R^6$ and $R^7$ form together a group of —CO—$NR^{10}$—CO— includes a methoxy group, an ethoxy group, an n-propoxy group, an isopropoxy group, a cyclopropoxy group, an n-butoxy group, a sec-butoxy group, an isobutoxy group, a tert-butoxy group, an n-pentyloxy group, an isopentyloxy group, a cyclopentyloxy group, an n-hexyloxy group, a cyclohexyloxy group, etc. In the general formula of [1], [4], [6], [6"] and [17], the bridged alicyclic hydrocarbon group shown by $R^8$ when $R^7$ is —$COOR^8$ includes one having 7 to 12 carbon atoms such as an 1-adamantyl group, a 2-adamantyl group, a tricyclo [5,2,1,0$^{2,6}$] decanyl group, a norbornyl group, an isobornyl group, a bicyclo [3,3,1] nonyl group and a bicyclo [3,2,1] octyl group. In the general formula [1], [2], [6], [6'], [6"], [7] and [17], the aralkyl group shown by $R^4$ includes a benzyl group, a phenethyl group, a phenylpropyl group, a methylbenzyl group, a methylphenethyl group, an ethylbenzyl group, etc. The ring formed by $R^2$ and $R^3$ includes a cycloalkane ring such as a cycloheptane ring and a cyclohexane ring, and the ring formed by $R^2$ and $R^3$ or by $R^3$ and $R^4$ includes an oxygen-containing saturated heterocyclic ring such as tetrahydrofuran ring and a tetrahydropyrane ring.

The specific examples of the polymers of the present invention shown by the general formula [1] are poly(p-1-ethoxyethoxystyrene/p-tert-butoxystyrene), poly(p-1-methoxyethoxystyrene/p-tert-butoxystyrene), poly(p-1-ethoxyethoxystyrene/p-isopropoxystyrene), poly(p-1-ethoxypropoxystyrene/p-tert-butoxystyrene), poly(p-1-ethoxyethoxystyrene/p-tetrahydropyranyloxystyrene), poly(p-1-ethoxyethoxystyrene/p-tert-butoxycarbonyloxystyrene), poly(p-1-cyclohexyloxyethoxystyrene/p-tert-butoxystyrene), poly(p-1-phenyloxyethoxystyrene/styrene), poly(p-1-ethoxyethoxystyrene/p-tert-butoxystyrene/methyl methacrylate), poly(p-1-benzyloxyethoxystyrene/p-methoxystyrene/fumaronitrile), poly(p-1-ethoxyethoxystyrene/styrene/cyclohexyl methacrylate), poly(p-1-ethoxyethoxystyrene/p-tert-butoxystyrene/p-hydroxystyrene), poly(p-1-ethoxyethoxystyrene/1-adamantyl methacrylate), poly(p-1-ethoxyethoxystyrene/styrerne/isobornyl acrylate), poly(p-1-ethoxyethoxystyrene/2-adamantyl acrylate), poly(p-1-ethoxyethoxystyrene/isobornyl acrylate), poly(p-1-ethoxyethoxystyrene/2-adamantyl acrylate/p-hydroxystyrene), poly(p-1-ethoxyethoxystyrene/isobornyl acrylate/p-hydroxystyrene), poly(p-1-cyclohexyloxyethoxystyrene/cyclohexyl acrylate/p-hydroxystyrene), poly(p-1-methoxy-1-methylethoxystyrene/fumaronitrile/p-hydroxystyrene), poly(p-1-ethoxyethoxystyrene/cyclohexyl methacrylate/p-hydroxystyrene), poly(p-1-ethoxyethoxystyrene/tricyclo [5,2,1,0$^{2,6}$] decanyl acrylate/p-hydroxystyrene), poly(p-1-ethoxyethoxystyrene/bicyclo [3,3,1]nonyl acrylate/p-hydroxystyrene), poly(p-1-ethoxyethoxystyrene/p-acetyloxystyrene/p-hydroxystyrene), poly(p-1-methoxy-1-methylethoxystyrene/bicyclo [3,2,1] octyl methacrylate/p-hydroxystyrene), poly(m-1-ethoxyethoxystyrene/m-hydroxystyrene/isobornyl methacrylate), poly(p-1-isobutoxyethoxystyrene/p-acetyloxystyrene), poly(p-1-cyclohexyloxyethoxystyrene/p-tetrahydropyranyloxystyrene), poly(p-1-cyclohexyloxyethoxystyrene/p-tert-butoxycarbonyloxystyrene), poly(p-1-ethoxyethoxystyrene/p-tert-butoxystyrene), poly(p-1-ethoxyethoxystyrene/maleic anhydride), poly(p-1-methoxy-1-methylethoxystyrene/isobornyl acrylate), poly(p-1-cyclohexyloxyethoxystyrene/maleicanhydride), poly(p-1-isobutoxyethoxystyrene/norbornyl mathacrylate), poly(p-1-ethoxypropoxystyrene/cyclohexyl acrylate), poly(p-1-ethoxyethoxystyrene/bicyclo [3,2,1]nonyl acrylate), poly(p-1-ethoxyethoxystyrene/p-tert-butoxystyrene/cyclohexylacrylate), poly(p-1-cyclohexyloxyethoxystyrene/p-acetyloxystyrene/isobornyl acrylate), poly(p-1-cyclohexyloxyethoxystyrene/p-tert-butoxystyrene/isobomyl acrylate), poly(p-1-cyclohexyloxyethoxystyrene/p-tert-butoxycarbonyloxystyrene/isobornyl acrylate), poly(p-1-ethoxyethoxystyrene/p-tert-butoxystyrene/isobornyl acrylate), poly(p-1-ethoxypropoxystyrene/p-tert-butylstyrene/isobornyl acrylate), poly(p-1-methoxyethoxystyrene/p-tert-butoxystyrene/p-hydroxystyrene), poly(p-1-ethoxyethoxystyrene/p-isopropoxystyrene/p-hydroxystyrene), poly(p-1-ethoxypropoxystyrene/p-tert-butoxystyrene/p-hydroxystyrene), poly(p-1-ethoxyethoxystyrene/p-tetrahydropyranyloxystyrene/p-hydroxystyrene), poly(p-1-ethoxyethoxystyrene/p-tert-butoxycarbonyloxystyrene/p-hydroxystyrene), poly(p-1-cyclohexyloxyethoxystyrene/p-tert-butoxystyrene/p-hydroxystyrene), poly(p-1-phenyloxyethoxystyrene/styrene/p-hydroxystyrene), poly(p-1-ethoxyethoxystyrene/p-tert-butoxystyrene/methyl methacrylate/p-hydroxystyrene), poly(p-1-benzyloxyethoxystyrene/p-methoxystyrene/fumaronitrile/p-hydroxystyrene), poly(p-1-ethoxyethoxystyrene/styrene/cyclohexyl methacrylate/p-hydroxystyrene), etc., but the resin is not limited to the above examples by any means.

The polymer of the present invention shown by the general formula [1] can easily be prepared, for example, by the following four methods after the manner described in Japanese Patent Publications-Kokai- No. 211258/1992, No. 249682/1993, No. 53621/1998, etc.

[Method A]

With the use of the monomer shown by the following general formula [2'], [3'] and [4'] as starting material, a per se known radical polymerization using an organic peroxide or an azo compound as a polymerization initiator, a per se known anion living polymerization using n-butyl lithium or potassium naphathalene or a living radical polymerization using 2-hydroxyethyl dichloroacetate, α, α-dichloroacetophenone or other halogen compound or an organic peroxide, an azo compound, etc. as an initiator and ruthenium complex, iron complex, copper complex or other transition metal complex as a catalyst are conducted, followed by after-treatment after a conventional manner, whereby the object polymer can be obtained.

[Method B]

With the use of commercially available p-tert-butoxystyrene and the monomers shown by the general formula [3'] and [4'] as starting materials, a polymerization is conducted by the same manner as in the above Method A, and a suitable amount of the tert-butyl groups is removed from the resulting polymer in the presence of an acid catalyst after a conventional manner, and then a suitable amount of an ethenyl compound or a derivative thereof is reacted with the phenolic hydroxy group of the resulting polymer after a conventional manner, whereby the object polymer can be obtained.

[Method C]

With the use of commercially available p-acetoxystyrene and the monomers shown by the general formula [3'] and [4'] as starting materials, a polymerization is conducted by the same manner as in the above Method A, and a suitable amount of the acetyl groups is removed from the resulting polymer in the presence of a basic catalyst after a conventional manner, and then a suitable amount of an ethenyl compound or a derivative thereof is reacted with the phenolic hydroxy group of the resulting polymer after a conventional manner, whereby the object polymer can be obtained.

[Method D]

With the use of commercially available p-tert-butoxystyren and if necessary the monomer shown by the general formula [4'] as starting materials, a polymerization is conducted by the same manner as in the above Method A, and the tert-butyl group is removed from the resulting polymer in the presence of an acid catalyst after a conventional manner to give poly(p-hydroxystyren) or a polymer comprising a monomer unit originated from p-hydroxystyrene and a monomer unit originated from the monomer unit shown by the general formula [4'], then a suitable amount of an ethenyl compound or a derivative thereof is reacted with the phenolic hydroxy group of the resulting polymer after a conventional manner and the resultant is subjected to tert-butoxycarbonylation or tetrahydrofuranylation, whereby the object polymer can be obtained. Poly (p-hydroxystyren) or a polymer comprising a monomer unit originated from p-hydroxystyrene and a monomer unit originated from the monomer unit shown by the general formula [4'] can be obtained also by conducting a polymerization with the use of a commercially available p-acetoxystyrene and if necessary a monomer shown by the general formula [4'] as starting materials after the same manner as in the above Method A, followed by removing the acetyl group in the presence of a basic catalyst after a conventional manner.

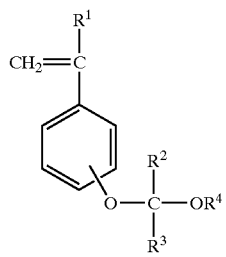
[2']

(wherein $R^1$, $R^2$ and $R^4$ have the same meaning)

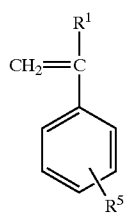
[3']

(wherein $R^1$ and $R^5$ have the same meaning as above)

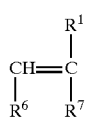
[4']

(wherein $R^4$, $R^6$ and $R^7$ have the same meaning as above).

The ethenyl compound or a derivative thereof used in the above mentioned methods includes one shown by the following general formula [18].

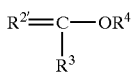
[18]

(wherein $R^{2'}$=is an alkylidene group, and $R^3$ and $R^4$ have the same meaning as above).

In the general formula [18], the alkylidene group shown by $R^{2'}$=may be straight chained or branched one and preferably one having 1 to 6 carbon atoms, which is specifically exemplified by a methylidene group, an ethylidene group, an n-propylidene group, an isopropylidene group, an n-butylidene group, an isobutylidene group, a sec-butylidene group, a tert-butylidene group, an n-pentylidene group, an isopentylidene group, an n-hexylidene group, etc.

Among them, the ethenyl compound or a derivative thereof shown by the following general formula [18'] is preferable.

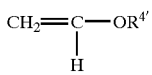
[18']

(wherein $R^{4'}$ has the same meaning as above).

The specific examples of the ethenyl compound or a derivative thereof shown by the general formula [18] are ethylvinylether, cyclohexylvinylether, etc.

In the above mentioned methods, the typical reaction of the compound shown by general formula [18'] as the ethenyl compound or a derivative thereof and poly(p-hydroxystyrene) derived from the resulting polymer obtained by the polymerization with the use of commercially available p-tert-butoxystyrene or p-acetoxystyrene and the monomers shown by the general formula [3'] and [4'] as starting materials is shown in [Equation 1] mentioned below.

[Equation 1]

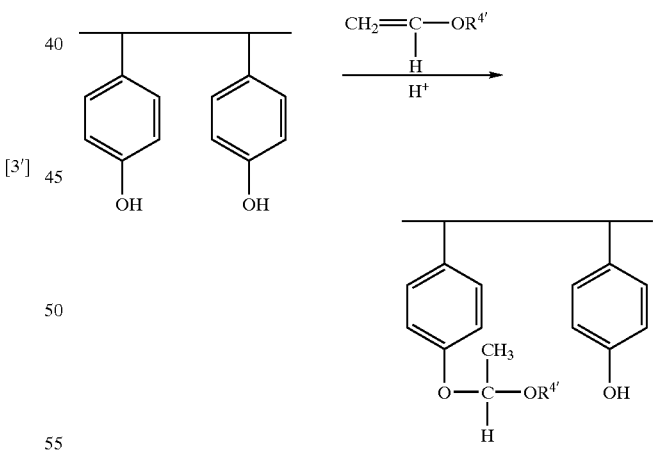

A molecular weight of the polymer shown by the general formula [1] of the present invention is generally 3,000 to 500,000, preferably 5,000 to 200,000 in weight-average molecular weight basis by GPC measurement using polystyrene as a standard, and a dispersibility (a ratio of weight-average molecular weight to number average molecular weight) of the polymer is generally 1,00 to 3,00, preferably 1.02 to 2.00, respectively.

The photo-sensitive compound capable of generating an acid by irradiation with an actinic radiation may be any one which can generate an acid by exposure by irradiation with KrF excimer laser and other deep UV rays or by irradiation with X rays, electron beams, etc. and has no bad influence upon resist pattern formation, and particularly preferable one in the present invention includes one shown by the following general formula [9],[10],[12],[13],[14],[16], etc.

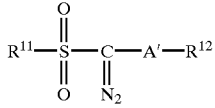
[9]

[wherein $R^{11}$ and $R^{12}$ are each independently an alkyl group or a haloalkyl group, and A' is a sulfonyl group or a carbonyl group].

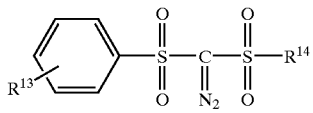
[10]

[wherein $R^{13}$ is a hydrogen atom, a halogen atom, an alkyl group, an alkoxy group or a haloalkyl group, and $R^{14}$ is an alkyl group, a haloalkyl group or a group of the following general formula [11]

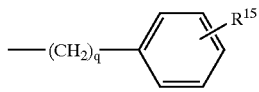
[11]

{wherein $R^{15}$ is a hydrogen atom, a halogen atom, an alkyl group, an alkoxy group or a haloalkyl group and q is 0 or an integer of 1 to 3}].

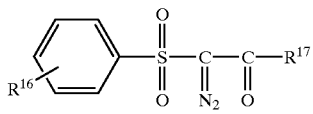
[12]

[wherein $R^{16}$ is a hydrogen atom, a halogen atom, an alkyl group or a trifluoromethyl group, and $R^{17}$ is an alkyl group, an aralkyl group, an alkoxy group, a phenyl group or a tolyl group].

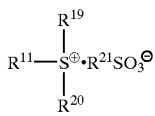
[13]

[wherein $R^{18}$ is an alkyl group, a phenyl group, a substituted phenyl group or an aralkyl group, $R^{19}$ and $R^{20}$ are each independently a hydrogen atom, an alkyl group, a phenyl group, a substituted phenyl group or an aralkyl group and $R^{21}$ is a fluoroalkyl group, a trifluoromethylphenyl group, a methyl group, a naphthyl group or a tolyl group].

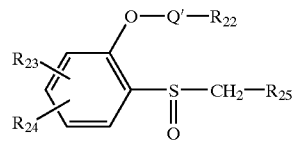
[14]

[wherein $R^{22}$ is an alkyl group, a fluoroalkyl group, a phenyl group, a substituted phenyl group or an aralkyl group, Q' is a sulfonyl group or a carbonyl group, and $R^{23}$ and $R^{24}$ are each independently a hydrogen atom, a methyl group, a methoxy group, a nitro group, a cyano group, a hydroxy group or a group shown by the following general formula [15]

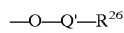
[15]

(wherein $R^{26}$ is an alkyl group, a fluoroalkyl group, a phenyl group, a substituted phenyl group or an aralkyl group, Q' is a sulfonyl group or a carbonyl group), and $R^{25}$ is a hydrogen atom, a methyl group or an ethyl group].

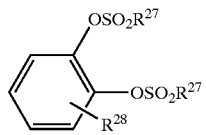
[16]

[wherein $R^{27}$ is an alkyl group, a fluoroalkyl group, a phenyl group, a substituted phenyl group or an aralkyl group, $R^{28}$ is a hydrogen atom, a methyl group, a fluoroalkyl group, a methoxy group, a nitro group, a cyano group, a hydroxy group or a group shown by the above general formula [15]].

In the general formula [9], the alkyl group or the alkyl group in the haloalkyl group shown by $R^{11}$ and $R^{12}$ may be straight chained, branched or cyclic one and preferably one having 1 to 10 carbon atoms, which is specifically exemplified by a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a tert-pentyl group, an 1-methylpentyl group, a cyclopentyl group, an n-hexyl group, an isohexyl group, a cyclohexyl group, a heptyl group, an octyl group, a nonyl group, a decyl group, etc.

The halogen in the haloalkyl group includes chlorine, bromine, fluorine and iodine.

In the general formula [10], the alkyl group or the alkyl group in the haloalkyl group shown by $R^{13}$ may be straight chained, branched or cyclic one and preferably one having 1 to 5 carbon atoms, which is specifically exemplified by a methyl group, an ethyl group, an n-propyl group, an isopropyl group, an n-butyl group, an isobutyl group, a tert-butyl group, a sec-butyl group, an n-pentyl group, an isopentyl group, a tert-pentyl group, an 1-methylpentyl group, etc., and the halogen atom or halogen in the haloalkyl group shown by $R^{13}$ includes chlorine, bromine, fluorine and iodine. The alkoxy group shown by $R^{13}$ may be straight chained or branched and preferably one having 1 to 5 carbon atoms, which is specifically exemplified by a methoxy group, an ethoxy group, an n-propoxy group, an isopropoxy group, an n-butoxy group, an isobutoxy group, a tert-butoxy group, a sec-butoxy group, an n-pentyloxy group, an isopentyloxy group, etc. The alkyl group or the alkyl group in the haloalkyl group shown by $R^{14}$ may be straight chained, branched or cyclic one and preferably one having 1 to 10 carbon atoms, which is specifically exemplified by a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a tert-pentyl group, an 1-methylpentyl group, a cyclopentyl group, an n-hexyl group, an isohexyl group, a cyclohexyl group, a heptyl group, an octyl group, a nonyl group, a decyl group, etc., and the halogen in the haloalkyl group includes chlorine, bromine, fluorine and iodine.

In the general formula [11], the alkyl group or the alkyl group in the haloalkyl group shown by $R^{15}$ may be straight chained or branched one and preferably one having 1 to 6 carbon atoms, which is specifically exemplified by a methyl group, an ethyl group, an n-propyl group, an isopropyl group, an n-butyl group, an isobutyl group, a tert-butyl group, a sec-butyl group, an n-pentyl group, an isopentyl group, a tert-pentyl group, an 1-methylpentyl group, an n-hexyl group, an isohexyl group, etc. The alkoxy group shown by $R^{15}$ having 1 to 6 carbon atoms may be straight chained or branched and is preferably one having 1 to 5 carbon atoms, which is specifically exemplified by a methoxy group, an ethoxy group, an n-propoxy group, an isopropoxy group, an n-butoxy group, an isobutoxy group, a tert-butoxy group, a sec-butoxy group, an n-pentyloxy group, an isopentyloxy group, an n-hexyloxy group, an isohexyloxy group, etc. and the halogen atom or halogen in the haloalkyl group shown by $R^{15}$ includes chlorine, bromine, fluorine and iodine.

In the general formula [12], the alkyl group shown by $R^{16}$ may be straight chained or branched one and preferably one having 1 to 5 carbon atoms, which is specifically exemplified by a methyl group, an ethyl group, an n-propyl group, an isopropyl group, an n-butyl group, an isobutyl group, a tert-butyl group, a sec-butyl group, an n-pentyl group, an isopentyl group, a tert-pentyl group, an 1-methylpentyl group, etc., and the halogen atom shown by $R^{16}$ includes chlorine, bromine, fluorine and iodine. The alkyl group shown by $R^{17}$ may be straight chained, branched or cyclic one and preferably one having 1 to 10 carbon atoms, which is specifically exemplified by a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a tert-pentyl group, an 1-methylpentyl group, a cyclopentyl group, an n-hexyl group, an isohexyl group, a cyclohexyl group, a heptyl group, an octyl group, a nonyl group, a decyl group, etc.

The aralkyl group shown by $R^{17}$ includes a benzyl group, a phenethyl group, a phenylpropyl group, a methylbenzyl group, a methylphenethyl group, an ethylbenzyl group, etc. The alkoxy group shown by $R^{17}$ may be straight chained or branched one and is exemplified by one having 1 to 6 carbon atoms such as a methoxy group, an ethoxy group, an n-propoxy group, an isopropoxy group, an n-butoxy group, an isobutoxy group, a tert-butoxy group, a sec-butoxy group, an n-pentyloxy group, an isopentyloxy group, an n-hexyloxy group and an isohexyloxy group.

The alkyl group shown by $R^{18}$, $R^{19}$ and $R^{20}$ in the general formula [13] may be straight chained, branched or cyclic one and preferably one having 1 to 8 carbon atoms, which is specifically exemplified by a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a tert-pentyl group, an 1-methylpentyl group, a cyclopentyl group, an n-hexyl group, an isohexyl group, a cyclohexyl group, a heptyl group, an octyl group, etc., and the substituted phenyl group includes a tolyl group, an ethylphenyl group, a tert-butylphenyl group, a chlorophenyl group, etc. The aralkyl group includes a benzyl group, a phenethyl group, a phenylpropyl group, a methylbenzyl group, a methylphenethyl group, an ethylbenzyl group, etc. The alkyl group in the fluoroalkyl group shown by $R^{21}$ may be straight chained or branched one and preferably one having 1 to 8 carbon atoms, which is specifically exemplified by a methyl group, an ethyl group, an n-propyl group, an isopropyl group, an n-butyl group, an isobutyl group, a tert-butyl group, a sec-butyl group, an n-pentyl group, an isopentyl group, a tert-pentyl group, an 1-methylpentyl group, an n-hexyl group, an isohexyl group, a heptyl group, an octyl group, etc. and the total number of the fluorine atoms substituted is preferably 1 to 17.

In the general formula [14], the alkyl group shown by $R^{22}$ may be straight chained, branched or cyclic one and preferably one having 1 to 6 carbon atoms, which is specifically exemplified by a methyl group, an ethyl group, an n-propyl group, an isopropyl group, an n-butyl group, an isobutyl group, a tert-butyl group, a sec-butyl group, an n-pentyl group, an isopentyl group, a cyclopentyl group, an n-hexyl group, a cyclohexyl group, etc., the substituted phenyl group includes a tolyl group, an ethylphenyl group, a tert-butylphenyl group, a chlorophenyl group, etc. and the aralkyl group includes a benzyl group, a phenethyl group, a phenylpropyl group, a methylbenzyl group, a methylphenethyl group, an ethylbenzyl group, etc. The alkyl group in the fluoroalkyl group may be straight chained or branched one and preferably one having 1 to 8 carbon atoms, which is specifically exemplified by a methyl group, an ethyl group, an n-propyl group, an isopropyl group, an n-butyl group, an isobutyl group, a tert-butyl group, a sec-butyl group, an n-pentyl group, an isopentyl group, an n-hexyl group, a heptyl group, an octyl group, etc. The total number of the fluorine atoms substituted is preferably 1 to 17.

In the general formula [15], the alkyl group shown by $R^{26}$ may be straight chained, branched or cyclic one and preferably one having 1 to 6 carbon atoms, which is specifically exemplified by a methyl group, an ethyl group, an n-propyl group, an isopropyl group, an n-butyl group, an isobutyl group, a tert-butyl group, a sec-butyl group, an n-pentyl group, an isopentyl group, a cyclopentyl group, an n-hexyl group, a cyclohexyl group, etc., the substituted phenyl group includes a tolyl group, an ethylphenyl group, a tert-butylphenyl group, a chlorophenyl group, etc. and the aralkyl group includes a benzyl group, a phenethyl group, a phenylpropyl group, a methylbenzyl group, a methylphenethyl group, an ethylbenzyl group, etc. The alkyl group in the fluoroalkyl group may be straight chained or branched one and preferably one having 1 to 8 carbon atoms, which is specifically exemplified by a methyl group, an ethyl group, an n-propyl group, an isopropyl group, an n-butyl group, an isobutyl group, a tert-butyl group, a sec-butyl group, an n-pentyl group, an isopentyl group, an n-hexyl group, a heptyl group, an octyl group, etc. The total number of the fluorine atoms substituted is preferably 1 to 17.

In the general formula [16], the alkyl group shown by $R^{27}$ may be straight chained, branched or cyclic one and preferably one having 1 to 6 carbon atoms, which is specifically exemplified by a methyl group, an ethyl group, an n-propyl group, an isopropyl group, an n-butyl group, an isobutyl group, a tert-butyl group, a sec-butyl group, an n-pentyl group, an isopentyl group, a cyclopentyl group, an n-hexyl group, a cyclohexyl group, etc., the substituted phenyl group includes a tolyl group, an ethylphenyl group, a tert-butylphenyl group, a chlorophenyl group, etc. and the aralkyl group includes a benzyl group, a phenethyl group, a phenylpropyl group, a methylbenzyl group, a methylphenethyl group, an ethylbenzyl group, etc. The alkyl group in the fluoroalkyl group shown by $R^{27}$ and $R^{28}$ may be straight chained or branched one and preferably one having 1 to 8 carbon atoms, which is specifically exemplified by a methyl group, an ethyl group, an n-propyl group, an isopropyl group, an n-butyl group, an isobutyl group, a tert-butyl group, a sec-butyl group, an n-pentyl group, an isopentyl group, an n-hexyl group, a heptyl group, an octyl group, etc. The total number of the fluorine atoms substituted is preferably 1 to 17.

The specific preferable examples of the acid generators used in the present invention are as follows; one shown by the general formula [9] which includes 1-cyclohexylsulfonyl-(1,1-dimethylethylsulfonyl) diazomethane, bis(1,1-dimethylethylsulfonyl) diazomethane, bis(1-methylethylsulfonyl)diazomethane, bis (cyclohexylsulfonyl)diazomethane, 1-cyclohexylsulfonyl-1-cyclohexylcarbonyl diazomethane, 1-diazo-1-cyclohexylsulfonyl-3,3-dimethylbutan-2-on, 1-diazo-1-methylsulfonyl-4-phenylbutan-2-on, 1-diazo-1-(1,1-dimethylethylsulfonyl)-3,3-dimethyl-2-butanone, 1-acetyl-1-(1-methylethylsulfonyl)diazomethane, etc.; one shown by the general formula [10]) which includes bis(p-toluenesulfonyl)diazomethane, bis(2,4-dimethylbenzenesulfonyl)diazomethane, methylsulfonyl-p-toluenesulfonyl diazomethane, bis(p-tert-butylphenylsulfonyl)diazomethane, bis(p-chlorobenzenesulfonyl)diazomethane, cyclohexylsulfonyl-p-toluenesulfonyl diazomethane, etc.; one shown by the general formula [12] which includes 1-p-toluenesulfonyl-1-cyclohexycarbonyl diazomethane, 1-diazo-1-(p-toluenesulfonyl)-3,3-dimethylbutan-2-on, 1-diazo-1-benzenesulfonyl-3,3-dimethylbutan-2-on, 1-diazo-1-(p-toluenesulfonyl)-3-methylbutan-2-on, etc.; one shown by the general formula [13] which includes triphenylsulfonium/trifluoromethanesulfonate, triphenylsulfonium/perfluorooctanesulfonate, diphenyl-p-tolylsulfonium/perfluorooctanesulfonate, tris(p-tolyl)sulfonium/perfluorooctanesulfonate, tris(p-chlorobenzene)sulfonium/trifluoromethanesulfonate, tris(p-tolyl)sulfonium/trifluoromethanesulfonate, trimethylsulfonium/trifluoromethanesulfonate, dimethylphenylsulfonium/trifluoromethanesulfonate, dimethyl-p-tolylsulfonium/trifluoromethanesulfonate, dimethyl-p-tolylsulfonium/perfluorooctane sulfonate, triphenylsulfonium/p-toluenesulfonate, triphenylsulfonium/methanesulfonate, triphenylsulfonium/10-camphorsulfonate, diphenyl-p-tolylsulfonium/trifluoromethanesulfonate, diphenyl-p-tolylsulfonium/methanesulfonate, diphenyl-p-tolylsulfonium/p-toluenesulfonate, diphenyl-p-tolylsulfonium/p-trifluoromethylphenylsulfonate, diphenyl-p-tolylsulfonium/2-naphthalenesulfonate, diphenyl-p-tolylsulfonium/10-camphorsulfonate, diphenyl-p-tert-butylphenylsulfonium/trifluoromethanesulfonate, diphenyl-p-tert-butylsulfonium/p-toluenesulfonate, diphenyl-p-tert-butylphenylsulfonium/perfulorooctanesulfonate, diphenyl-p-tert-butylphenylsulfonium/10-camphorsulfonate, diphenyl-p-tert-butoxyphenylsulfonium/trifluoromethanesulfonate, diphenyl-p-tert-butoxyphenylsulfonium/p-toluenesulfonate, diphenyl-p-tert-butoxyphenylsulfonium/perfluorooctanesulfonate, diphenyl-p-tert-butylphenylsulfonium/10-camphorsulfonate, diphenyl-p-tert-butoxycarbonyloxyphenylsulfonium/10-camphorsulfonate, diphenyl-p-tert-butoxycarbonyloxyphenylsulfonium/trifluoromethanesulfonate, diphenyl-p-tert-butoxycarbonyloxyphenylsulfonium/p-toluenesulfonate, diphenyl-p-tert-butoxycarbonyloxyphenylsulfonium/perfluorooctanesulfonate, diphenyl-p-cyclohexylphenylsulfonium/trifluoromethanesulfonate, diphenyl-p-cyclohexylphenylsulfonium/p-toluenesulfonate, diphenyl-p-cyclohexylphenylsulfonium/perfluorooctanesulfonate, diphenyl-p-cyclohexylphenylsulfonium/10-camphorsulfonate, etc.; one shown by the general formula [14] which includes 2,6-di-trifluoromethanesulfonyloxyacetophenone, 2,6-di-trifluoromethanesulfonyloxypropiophenone, 2,3,4-tris-trifluoromethanesulfonyloxyacetophenone, 2,6-di-methanesuflonyloxyacetophenone, 2,6-di-methanesulfonyloxypropiophenone, 2,3,4-tris-methanesulfonyloxyacetophenone, 2-trifluoromethanesulfonyloxyacetophenone, 2-methanesulfonyloxyacetophenone, 2-n-butanesuflonyloxyacetophenone, 2,6-di-n-butanesulfonyloxyacetophenone, 2,3,4-tris-n-butanesulfonyloxyacetophenone, 2,6-di-perfuloropropanecarboxyacetophenone, 2,3,4-tris-perfuloropropanecarboxyacetophenone, 2,6-di-p-toluenesuflonylacetophenone, 2,6-di-p-toluenesulfonylpropiophenone, 2,6-di-trifluoroacetyloxyacetophenone, 2-trifluoroacetyloxy-6-methoxyacetophenone, 6-hydroxy-2-perfluorobutanesulfonyloxyacetophenone, 2-trifluoroacetyloxy-6-nitroacetophenone, 2,3,4-tris-trifluoroacetyloxyacetophenone, 2,6-di-perfluoropropanoyloxyacetophenone, etc.; one shown by the general formula [16] which includes 1,2,3-tris-methanesulfonyloxybenzene, 1,2,3-tris-p-toluenesulfonyloxybenzene, 1,2,3-tris-trifluoromethanesulfonyloxybenzene, 1,2,3-tris-perfluorobutanesulfonyloxybenzene, 1,2,3-tris-cyclohexylsulfonyloxybenzene, 1,2-di-methanesulfonyloxy-3-nitrobenzene, 2,3-di-methanesulfonyloxyphenol, 1,2,4-tris-p-toluenesulfonyloxybenzene, 1,2,4-tris-methanesulfonyoxybenzene, 1,2,4-tris-trifluoromethanesulfonyloxybenzene, 1,2,4-tris-cyclohexylsulfonyloxybenzene, 1,2-di-n-butanesulfonyloxy-3-nitrobenzene, 1,2,3-tris-perfluorooctanesulfonyloxybenzene, 1,2-di-perfluorobutanesulfonyloxyphenol, etc. Those acid generator may be used alone or in combinations of two or more thereof. The acid generator of the present invention can easily be obtained by methods disclosed in Japanese Patent Publication-Kokai-Nos. 210960/1992, 211258/1992, 249682/1993, etc.

A ratio of the polymer ingredient to the acid generator in the resist composition of the present invention is such as generally 1 to 30 wt parts, preferably 1 to 20 wt parts of the acid generator relative to 100 wt parts of the polymer.

The solvent of the present invention may be any one which can dissolve the polymer of the present invention, the acid generator and other ingredients used upon necessity such as a basic compound, a surfactant, an UV-ray absorber and a dissolving accelerator, and use is generally made of those showing good film-forming ability, including methyl Cellosolve acetate, ethyl Cellosolve acetate, propylene glycol monomethyl ether acetate, propylene glycol monoethyl ether acetate, ethyl lactate, methyl pyruvate, ethyl pyruvate, methyl 3-methoxypropionate, N-methyl-2-pyrrolidone, 2-hepatanone, cyclohexanone, diethylene glycol monoethyl ether, diethylene glycol dimethyl ether, etc., but not limited thereto.

A ratio of the polymer ingredient to the solvent in the resist composition of the present invention is such as generally 3 to 30 wt parts, preferably 5 to 20 wt parts of the solvent relative to 1 wt part of the polymer. The solvent may be used alone or in combinations of two or more thereof.

A sensitivity adjustor used upon necessity in the resist composition of the present invention includes polyvinylpyridine, poly (vinylpyridine/methyl methacrylate), pyridine, N-methyl-2-pyrrolidone, monoalkylamines [the alkyl group includes straight chained, branched or cyclic one having 1 to 12 carbon atoms, such as 2-methylcyclohexyl and 4-t-butylcyclohexyl], dialkylamines [the alkyl group includes straight chained, branched or cyclic one having 1 to 12 carbon atoms, such as dicyclohexylamine and di-N-octylamine as preferable specific examples], trialkylamines [the alkyl group includes straight chained, branched or cyclic one having 1 to 12 carbon atoms, such as tri-n-propylamine, tri-n-butylamine, trihexylamine, dicyclohexylmethylamine, dioctylmethylamine and dimethyloctylamine as preferable specific examples], mono-, di- or trialkanolamines [specifically triisopropanolamine as preferable specific example], tetraalkylammonium hydroxide [the alkyl group includes straight chained, branched or cyclic one having 1 to 12 carbon atoms, such as tetramethylammonium hydroxide and tetra-n-butylammonium hydroxide as preferable specific examples], etc., but not limited thereto.

An amount of the sensitivity adjustor to be used is preferably 0.001 to 10 wt parts, more preferably 0.01 to 5 wt parts, relative to 100 wt parts of the polymer. The sensitivity adjustor may be used alone or in combinations of two or more thereof.

A surfactant used upon necessity in the resist composition of the present invention includes a nonionic one such as polyethylene glycol distearate, polyethylene glycol dilaurate, polyethylene glycol, polypropylene glycol, polyoxyethylene stearyl ether and polyoxyethylene cetyl ether, a fluorine-containing cationic one, a fluorine-containing nonionic one, a fluorine-containing anionic one, a cationic one, an anionic one, etc. Among the above, particularly preferable ones in the present invention are those showing good resist membrane-forming ability such as a fluorine-containing nonionic surfactant including Fluorad (a trade name of Sumitomo 3M, Ltd.), Surflon (a trade name of Asahi Glass Co., Ltd.), Unidyne (a trade name of Daikin Industries, Ltd.), Megafac (a trade name of Dainippon Ink & Chemicals, Incorp.) and Eftop (a trade name of Tohkem Products Corp.), but not limited thereto.

An amount of the surfactant to be used is 0.001 to 10 wt parts, preferably 0.005 to 5 wt parts, relative to 100 wt parts of the polymer.

An UV-ray absorber used upon necessity in the resist composition of the present invention includes 9-diazofluorenone, 9-(2-meethoxyethoxymethyl) anthracene, 9-(2-ethoxyethoxymethyl)anthracene, 9-fluorenone, 2-hydroxycarbazole, o-naththoquinone diazide derivative, 4-diazo-1,7-diphenylpentan-3,5-dione, etc. They may be used alone or in combination of two or more thereof.

An amount of the UV-ray absorber to be used in the present invention may be selected from a range which has been generally used in this kind of technical field.

A dissolving accelerator used upon necessity in the resist composition of the present invention includes N,N-dimethylformamide, N,N-dimethylacetamide, γ-butylolactone, etc. They may be used alone or in combination of two or more thereof.

An amount of the dissolving accelerator to be used in the present invention may be selected from a range which has been used generally in this kind of technical field.

The resist composition of the present invention is particularly suitable to a single layer or the most upper layer of a multiple layers in a surface resolution process, namely silylated surface resolution process, comprising silylating a chemically changed resist surface and then subjecting it to dry-development by oxygen dry plasma etching.

A pattern formation by the silylated surface resolution process includes the following one.

Namely, the resist composition of the present invention is applied on a semiconductor substrate plate, followed by baking to give a resist membrane, an actinic radiation is selectively irradiated thereon through a mask, followed by, if necessary, baking, and then silylating the exposed area by contacting with a suitable silylating agent, followed by dry-etching development, whereby the desired pattern can be formed.

More specifically, the following embodiment can be mentioned.

Formation of a pattern using the chemically-amplified type resist composition of the present invention as a single layer by a silylated surface resolution process can be conducted as follows.

Namely, the resist composition of the present invention is spin-coated on a semiconductor substrate plate such as $SiO_2$ (oxidized membrane), polysilicone, SiN, SiON, TiN, etc. and heated on a hot plate at 50 to 120° C. for 0.5 to 2 minutes to give a resist membrane of 0.3 to 2 µm thick. Then an actinic radiation (e.g. KrF excimer laser of 248.4 nm, deep UV-ray of less than 300 nm, electron beams, soft X-ray, etc.) is selectively irradiated through a mask, and if necessary, baked on a hot plate at 50 to 150° C. for 0.5 to 2 minutes (post baking), and the resultant is allowed to contact with a vapor of a silylating agent such as HMDS (hexamethyl disilazane), tetramethyldisilazane, DMSDMA (dimethyl silyldimethylamine), dimethyl silyldiethylamine, N,N-diethylaminotrimethylsilane and N,N-dimethylaminotrimethylsilane for 1 to 10 minutes, whereby the exposed areas are silylated, followed by dry-etching development using parallel flat plate type $O_2$ plasma (RIE; reactive ion etching), ECR etching, etc. to form the desired pattern.

In the following, the present invention is explained in details referring to Examples and Comparative examples, and the present invention is not limited thereto by any means.

A part of the polymers and the acid generators used in the Examples and Comparative examples were synthesized according to the methods disclosed in Japanese Patent Publication-Kokai- No. 210960/1992 (U.S. Pat. No. 5,216, 135); Japanese Patent Publication-Kokai-No. 211258/1992 (U.S. Pat. No. 5,350,660, EPC Publication No.0440374); Japanese Patent Publication-Kokai-No. 249682/1993(EPC Publication No. 0520642); Japanese Patent Publication-Kokai-No. 251259/1992; Y. Endo et al. Chem. Pharm. Bull., 29(12), 3753(1981); M. Desbois et al., Bull. Chem. Soc. France, 1974, 1956 or C. D. Beard et al., J. Org. Chem., 38, 3673 (1973), etc.

EXAMPLES

Example 1

Synthesis of Poly(p-tert-butoxystyrene/p-1-ethoxyethoxystyrene)

(1) To 100 g (0.567 mole) of p-tert-butoxystyrene was added 3 g of 2,2'-azobis (methyl 2-methylpropionate), followed by conducting a polymerization reaction in 1,4-dioxane under nitrogen gas streams at 80° C. for 6 hours. After cooling, the reaction solution was poured into 5000 ml of aqueous methanol solution to precipitate outs. Crystal was recovered by filtration and dried under reduced pressure to give 95.5 g of poly(p-tert-butoxystyrene) as white powdery crystal. A weight-average molecular weight was found about 20000 by GPC measurement using polystyrene as a standard.

(2) In 1,4-dioxane was dissolved 70 g of poly(p-tert-butoxystyrene) obtained in the above (1) and 70 ml of concentrated hydrochloric acid was added thereto, followed by conducting a reaction at 70° C. for 2 hours with agitation. After cooling, the reaction solution was poured into 3000 ml of ion-exchanged water to precipitate out. Crystal was recovered by filtration, washed with water and dried under reduced pressure to give 48.7 g of poly(p-tert-butoxystyrene/p-hydroxystyrene) as white powdery crystal. A ratio of p-tert-butoxystyrene unit to p-hydroxystyrene unit in the obtained polymer was found about 35:65 by $^1$HNMR measurement.

(3) In 150 ml of 1,4-dioxane were dissolved 15 g of poly(p-tert-butoxystyrene/p-hydroxystyrene) obtained in the above (2) and 8 g of ethyl vinyl ether and a catalytic amount of pyridinium p-toluenesulfonate was further added thereto, followed by conducting a reaction at room temperature for 24 hours with agitation. After the reaction, the reaction solution was poured into 2000 ml of ion-exchanged water to precipitate out. Crystal was recovered by filtration, washed with water and dried under reduced pressure to give 14.7 g of poly(p-tert-butoxystyrene/p-1-ethoxyethoxystyrene) as white powdery crystal. A ratio of p-tert-butoxystyrene unit to p-1-ethoxyethoxystyrene unit of the obtained polymer was found about 35:65 by $^1$HNMR measurement, and a weight-average molecular weight of the polymer was about 20000 by GPC measurement using polystyrene as a standard.

Example 2
Synthesis of Poly(p-tert-butoxycarbonyloxystyrene/p-1-ethoxyethoxystyrene/cyclohexyl Acrylate)

(1) To 50 g (0.284 mole) of p-tert-butoxystyrene and 43.8 g (0.284 mole) of cyclohexyl acrylate was added 3 g of 2,2'-azobis(methyl 2-methylpropionate), followed by conducting a polymerization reaction in 1,4-dioxane under nitrogen gas streams at 80° C. for 6 hours. After cooling, the reaction solution was poured in 5000 ml of aqueous methanol solution to precipitate out. Crystal was recovered by filtration and dried under reduced pressure to give 89.2 g of poly(p-tert-butoxystyrene/cyclohexyl acrylate) as white powdery crystal. A weight-average molecular weight of the polymer was about 21000 by GPC measurement using polystyrene as a standard.

(2) In 1,4-dioxane was dissolved 80 g of poly(p-tert-butoxystyrene/cyclohexyl acrylate) obtained in the above (1) and 70 ml of concentrated hydrochloric acid was added thereto, followed by conducting a reaction at 70° C. for 3 hours with agitation. After cooling, the reaction solution was poured into 3000 ml of ion exchanged water to precipitate out. Crystal was recovered by filtration, washed with water and dried under reduced pressure to give 65.4 g of poly(p-hydroxystyrene/cyclohexyl acrylate) as white powdery crystal. A ratio of p-hydroxystyrene unit to cyclohexyl acrylate unit of the obtained polymer was found about 50:50 by $^1$HNMR measurement.

(3) In 150 ml of 1,4-dioxane were dissolved 20 g of poly(p-hydroxystyrene/cyclohexyl acrylate) obtained in the above (2) and 3.5 g of ethyl vinyl ether and a catalytic amount of pyridinium p-toluenesulfonate was further added thereto, followed by conducting a reaction at room temperature for 24 hours with agitation. After the reaction, the reaction solution was poured into 2000 ml of ion-exchanged water to precipitate out. Crystal was recovered by filtration, washed with water and dried under reduced pressure to give 22.7 g of poly(p-hydroxystyrene/p-1-ethoxyethoxystyrene/cyclohexyl acrylate) as white powdery crystal. A ratio of p-1-ethoxyethoxystyrene unit, p-hydroxystyrene unit and cyclohexyl acrylate unit of the obtained polymer was found about 30:20:50 by $^1$HNMR measurement, and a weight average-molecular weight of the polymer was about 20000 by GPC measurement using polystyrene as a standard.

(4) In 100 ml of ethyl acetate was dissolved 20 g of poly(p-hydroxystyrene/p-1-ethoxyethoxystyrene/cyclohexyl acrylate) obtained in the above (3), and 6.5 g of di-tert-butyl dicarbonate and 4.8 g of anhydrous potassium carbonate were added thereto, followed by conducting a reaction at room temperature for 6 hours with agitation. After reaction, the reaction solution was poured into 1000 ml of ion exchanged water to precipitate out. Crystal was recovered by filtration, washed with water and dried under reduced pressure to give 19.2 g of poly(p-tert-butoxycarbonyloxystyrene/p-1-ethoxyethoxystyrene/cyclohexyl acrylate) as white powdery crystal. A ratio of p-tert-butoxycarbonyloxystyrene unit, p-1-ethoxyethoxystyrene unit and cyclohexyl acrylate unit of the obtained polymer was found about 30:20:50 by $^1$HNMR measurement, and a weight-average molecular weight of the polymer was about 21000 by GPC measurement using polystyrene as a standard.

Example 3
Synthesis of Poly(p-tetrahydropyranyloxystyrene/p-1-methoxyethoxystyrene/isobornyl Acrylate)

(1) To 70 g (0.397 mole) of p-tert-butoxystyrene and 35.4 g (0.170 mole) of isobornyl acrylate was added 1.5 g of 2,2'-azobis(methyl 2-methylpropionate), followed by conducting a polymerization reaction in 1,4-dioxane under nitrogen gas streams at 80° C. for 6 hours. After cooling, the reaction solution was poured into 5000 ml of aqueous methanol solution to precipitate out. Crystal was recovered by filtration and dried under reduced pressure to give 102.2 g of poly(p-tert-butoxystyrene/isobornyl acrylate) as white powdery crystal. A weight-average molecular weight was found about 56000 by GPC measurement using polystyrene as a standard.

(2) In 1,4-dioxane was dissolved 80 g of poly(p-tert-butoxystyrene/isobornyl acrylate) obtained in the above (1) and 80 ml of concentrated hydrochloric acid was added thereto, followed by conducting a reaction at 70° C. for 3 hours with agitation. After cooling, the reaction solution was poured into 3000 ml of ion-exchanged water to precipitate out. Crystal was recovered by filtration, washed with water and dried under reduced pressure to give 52.3 g of poly(p-hydroxystyrene/isobornyl acrylate) as white powdery crystal. A ratio p-hydroxystyrene unit to isobornyl acrylate unit in the obtained polymer was found about 70:30 by $^1$HNMR measurement.

(3) In 150 ml of 1,4-dioxane were dissolved 15 g of poly(p-hydroxystyrene/isobornyl acrylate) obtained in the above (2) and 6 g of ethyl vinyl ether and 3.2 g of 3,4-dihydro-2H-pyrane and a catalytic amount of pyridinium p-toluenesulfonate was further added thereto, followed by conducting a reaction at room temperature for 24 hours with agitation. After the reaction, the reaction solution was poured into 2000 ml of ion-exchanged water to precipitate out. Crystal was recovered by filtration, washed with water and dried under reduced pressure to give 14.7 g of poly(p-tetrahydropyranyloxystyrene/p-1-methoxyethoxystyrene/isobornyl acrylate) as white powdery crystal. A ratio of p-tetrahydropyranyloxystyrene unit, p-1-methoxyethoxystyrene unit and isobornyl acrylate unit of the obtained polymer was found about 20:50:30 by $^1$HNMR measurement, and a weight-average molecular weight of the polymer was about 57000 by GPC measurement using polystyrene as a standard.

Example 4

Synthesis of Poly(p-1-ethoxyethoxystyrene/isobornyl Acrylate)

(1) To 50 g (0.284 mole) of p-tert-butoxystyrene and 58.9 g (0.284 mole) of isobornyl acrylate was added 3 g of 2,2'-azobis(methyl 2-methylpropionate), followed by conducting a polymerization reaction in 1,4-dioxane under nitrogen gas streams at 80° C. for 6 hours. After cooling, the reaction solution was poured into 5000 ml of aqueous methanol solution to precipitate out. Crystal was recovered by filtration and dried under reduced pressure to give 105.4 g of poly(p-tert-butoxystyrene/isobornyl acrylate) as white powdery crystal. A weight-average molecular weight was found about 22000 by GPC measurement using polystyrene as a standard.

(2) In 1,4-dioxane was dissolved 80 g of poly(p-tert-butoxystyrene/isobornyl acrylate) obtained in the above (1) and 70 ml of concentrated hydrochloric acid was added thereto, followed by conducting a reaction at 70° C. for 3 hours with agitation. After cooling, the reaction solution was poured into 3000 ml of ion-exchanged water to precipitate out. Crystal was recovered by filtration, washed with water and dried under reduced pressure to give 58.1 g of poly(p-hydroxystyrene/isobornyl acrylate) as white powdery crystal. A ratio p-hydroxystyrene unit to isobornyl acrylate unit in the obtained polymer was found about 50:50 by $^1$HNMR measurement.

(3) In 150 ml of 1,4-dioxane were dissolved 15 g of poly(p-hydroxystyrene/isobornyl acrylate) obtained in the above (2) and 3.5 g of ethyl vinyl ether and a catalytic amount of pyridinium p-toluenesulfonate was further added thereto, followed by conducting a reaction at room temperature for 24 hours with agitation. After the reaction, the reaction solution was poured into 2000 ml of ion-exchanged water to precipitate out. Crystal was recovered by filtration, washed with water and dried under reduced pressure to give 14.7 g of poly(p-1-ethoxyethoxystyrene/isobornyl acrylate) as white powdery crystal. A ratio of p-1-methoxyethoxystyrene unit and isobornyl acrylate unit of the obtained polymer was found about 50:50 by $^1$HNMR measurement, and a weight-average molecular weight of the polymer was about 21000 by GPC measurement using polystyrene as a standard.

Example 5

A resist composition comprising the following ingredients was prepared.

| | |
|---|---|
| Poly [p-tert-butoxystyrene/p-(1-ethoxyethoxystyrene) styrene] (35:65) | 4.5 g |
| Bis (cyclohexylsulfonyl) diazomethane | 0.3 g |
| Bis (p-toluenesulfonyl) diazomethane | 0.15 g |
| Fluorine-containing nonionic surfactant (commercially available one) | 0.003 g |
| Tri-n-propylamine | 0.05 g |
| Propylene glycol monomethyl ether acetate | 27 g |

The above ingredients were blended with one another and filtered through 0.2 μm pore size filter to give a resist composition. Using this composition, a pattern formation was conducted by the following process.

The above composition was spin-coated on a silicone wafer, followed by baking at 90° C. for 90 seconds on a hot plate to give a resist membrane of 0.5 μm thick. KrF excimer laser of 248.2 nm (NA=0.55) was selectively exposed thereon through a mask, followed by post-baking at 105° C. for 90 seconds on a hot plate. The resultant was finally allowed to contact with HMDS (hexamethyldisilazane) vapor for 3 minutes to silylate the exposed areas, and then dry development was conducted by etching using parallel flat plate type O$_2$ plasma (RIE). The above process gave a rectangular and perpendicular pattern of 0.12 μm L & S as illustrated in FIG. 1. Exposure dose was 42 mJ/cm$^2$.

Examples 6 to 8

A resist composition of Table 1 was prepared and a pattern formation was conducted as in Example 5.

TABLE 1

| | | |
|---|---|---|
| Example 6 | Poly [p-tert-butoxycarbonyloxystyrene/p-(1-ethoxyethoxy) styrene/methyl methacrylate] (40:50:10) | 4.5 g |
| | Bis (cyclohexylsulfonyl) diazomethane | 0.3 g |
| | Fluorine-containing nonionic surfactant (commercially available one) | 0.003 g |
| | Tetrabutyl ammonium hydroxide | 0.03 g |
| | Propylene glycol monomethyl ether acetate | 27 g |
| Example 7 | Poly [p-tetrahydropyranyloxystyrene/p-(1-ethoxyethoxy) styrene/p-hydroxystyrene] (35:60:5) | 4.5 g 0.3 g |
| | Bis (cyclohexylsulfonyl) diazomethane | 0.3 g |
| | Triphenylsulfonium/perfluorooctanesulfonate | 0.15 g |
| | Fluorine-containing nonionic surfactant (commercially available one) | 0.003 g |
| | Tetramethyl ammonium hydroxide | 0.05 g |
| | Propylene glycol monomethyl ether acetate | 27 g |
| Example 8 | Poly [p-tert-butoxystyrene/p-(1-ethoxyethoxy) styrene/isobornyl acrylate/p-hydroxystyrene] (10:50:35:5) | 4.5 g |
| | Bis (cyclohexylsulfonyl) diazomethane | 0.3 g |
| | Trimethylsulfonium/trifluoromethanesulfonate | 0.15 g |
| | Fluorine-containing nonionic surfactant (commercially available one) | 0.003 g |
| | Dicyclohexylmethylamine | 0.06 g |
| | Propylene glycol monomethyl ether acetate | 27 g |

TABLE 2

| Example | Exposure dose mJ/cm$^2$ | Resolution μm L & S | Shape |
|---|---|---|---|
| 6 | 38 | 0.11 | Good |
| 7 | 44 | 0.12 | Good |
| 8 | 42 | 0.12 | Good |

Comparative Example 1

Using poly(p-tert-butoxycarbonyloxystyrene) in place of the polymer in Example 1, the following resist composition was prepared and a pattern formation was conducted after the same manner as Example 1.

| | |
|---|---|
| Poly (p-tert-butoxycarbonyloxystyrene) | 4.5 g |
| Bis (cyclohexylsulfonyl) diazomethane | 0.3 g |
| Bis (p-toluenesulfonyl) diazomethane | 0.15 g |
| Fluorine-containing nonionic surfactant (commercially available one) | 0.005 g |
| Tri-n-propylamine | 0.05 g |
| Proplylene glycol monomethyl ether acetate | 27 g |

Figure 2:
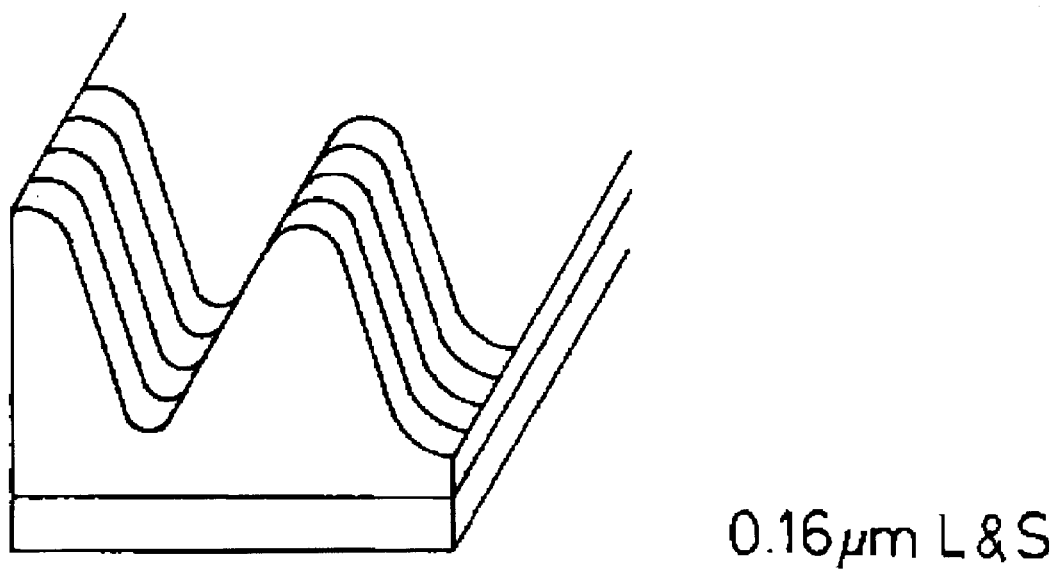
FIG. 2 is a cross-sectional view of the poor resolution shape of L & S pattern form obtained by using the resist composition wherein the polymer of the present invention is not used.

As a result, 0.18 μm L & S was resolved but fine pattern lower than it was not resolved because of deficient contrast as illustrated in FIG. 2.

Example 9

The following resist composition was prepared.

| | |
|---|---|
| Poly [p-tert-butoxycarbonyloxystyrene/p-(1-ethoxyethoxy) styrene/Isobornyl acrylate] (20:30:50) | 2.2 g |
| Diphenyl-p-trylsulfonium/perfluorooctanesulfonate | 0.11 g |
| Fluorine-containing nonionic surfactant (commercially available one) | 0.002 g |
| Tri-n-butylamine | 0.01 g |
| Propylene glycol monomethyl ether acetate | 53 g |

The above ingredients were blended with one another and filtered through 0.2 μm pore size filter to give a resist composition. Using this composition, a pattern formation was conducted by the following process.

Figure 3:
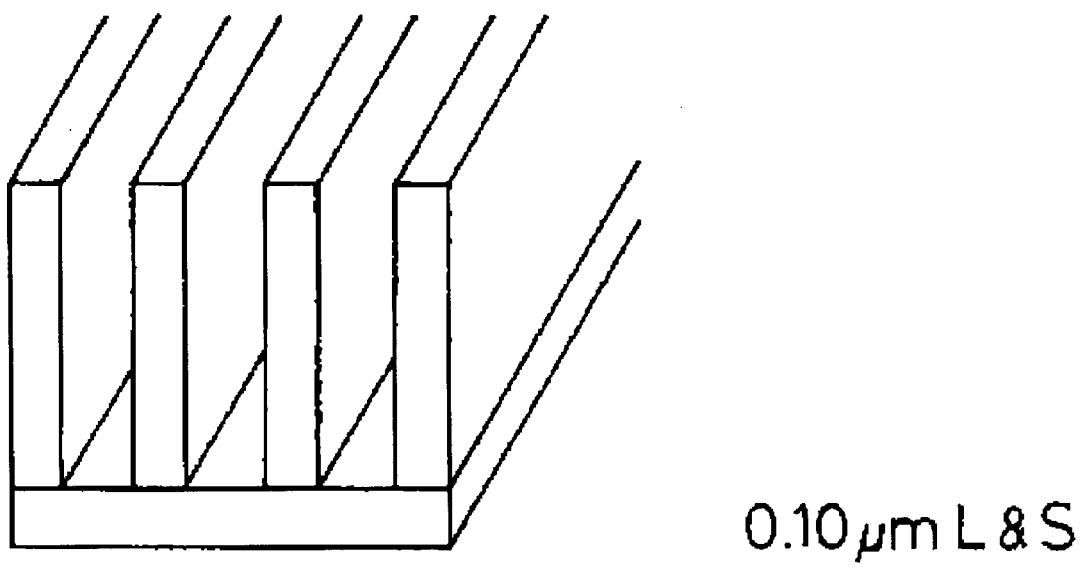
FIG. 3 is a cross-sectional view of the good shape of L & S pattern form obtained by using a resist composition wherein the polymer of the present invention is used.

A resist wherein novolac resin was used as the main resin component was spin-coated on a silicone wafer, followed by hard-baking at 200° C. for 120 seconds on a hot plate to give a resist membrane of 0.5 μm. Then, the above composition was spin-coated on a silicone wafer to form a layer of 0.1 μm, followed by baking at 90° C. for 90 seconds on a hot plate to give a resist membrane of 0.6 μm thick. ArF excimer laser of 193.0 nm (NA=0.60) was selectively exposed thereon through a mask, followed by post-baking at 105° C. for 90 seconds on a hot plate. The resultant was finally allowed to contact with HMDS (hexamethyldisilazane) vapor for 3 minutes to silylate the exposed areas, and then dry development was conducted by etching using parallel flat plate type RIE. The above process gave a rectangular and perpendicular pattern of 0.10 μm L & S as illustrated in FIG. 3. Exposure dose was 13 mJ/cm².

Examples 10 to 12

Resist compositions of Table 3 were prepared and a pattern formation was conducted by the same manner as Example 9.

TABLE 3

| Example 10 | Poly [p-tert-butoxystyrene/p-(1-ethoxyethoxyethoxy) styrene/methyl methacrylate] (20:40:20) | 2.2 g |
|---|---|---|
| | Triphenylsulfonium/trifluoromethanesulfonate | 0.11 g |
| | Fluorine-containing nonionic surfactant (commercially Available one) | 0.002 g |
| | Tetramethyl ammonium hydroxide | 0.01 g |
| | Propylene glycol monomethyl ether acetate | 53 g |
| Example 11 | Poly [p-tert-butoxycarbonyloxystyrene/p-(1-ethoxyethoxy) styrene/methyl methacrylate] (35:35:30) | 2.2 g |
| | Diphenyl-p-trisulfonium/perfluorooctanesulfonate | 0.05 g |
| | Triphenylsulfonium/perfluoromethanesulfonate | 0.06 g |

TABLE 3-continued

| | | |
|---|---|---|
| | Fluorine-containing nonionic surfactant (commercially Available one) | 0.002 g |
| | Triethylamine | 0.03 g |
| | Propylene glycol monomethyl ether acetate | 53 g |
| Example 12 | Poly [p-tetrahydropyranyloxystyrene/p-(1-ethoxyethoxy) styrene/isobornyl acrylate/p-hydroxystyrene] (10:45:40:5) | 2.2 g |
| | Triphenylsulfonium/trifluoromethanesulfonate | 0.07 g |
| | Trimethylsulfonium/trifluoromethanesulfonate | 0.05 g |
| | Fluorine-containing nonionic surfactant (commercially Available one) | 0.002 g |
| | Dicyclohexylmethylamine | 0.06 g |
| | Propylene glycol monomethyl ether acetate | 53 g |
| Example 13 | Poly [p-(1-ethoxyethoxy) styrene/isobornyl acrylate] (50:50) | 2.2 g |
| | Triphenylsulfonium/trifluoromethanesulfonate | 0.07 g |
| | Trimethylsulfonium/trifluoromethanesulfonate | 0.05 g |
| | Fluorine-containing nonionic surfactant (commercially Available one) | 0.002 g |
| | Dicyclohexylmethylamine | 0.06 g |
| | Propylene glycol monomethyl ether acetate | 53 g |

TABLE 4

| Example | Exposure dose mJ/cm² | Resolution μm L & S | Shape |
|---|---|---|---|
| 10 | 11 | 0.10 | Good |
| 11 | 13 | 0.11 | Good |
| 12 | 12 | 0.12 | Good |
| 13 | 11 | 0.10 | Good |

Comparative Example 2

Using poly(p-1-ethoxyethoxystyrene) in place of the polymer in Example 8, the following resist composition was prepared and a pattern formation was conducted after the same manner as Example 8.

| | |
|---|---|
| Poly (p-1-ethoxyethoyxstyrene) | 2.2 g |
| Triphenylsulfonium/trifluoromethanesulfonate | 0.11 g |
| Fluorine-containing nonionic surfactant (commercially available one) | 0.002 g |
| Tri-n-propylamine | 0.01 g |
| Proplylene glycol monomethyl ether acetate | 53 g |

Figure 4:
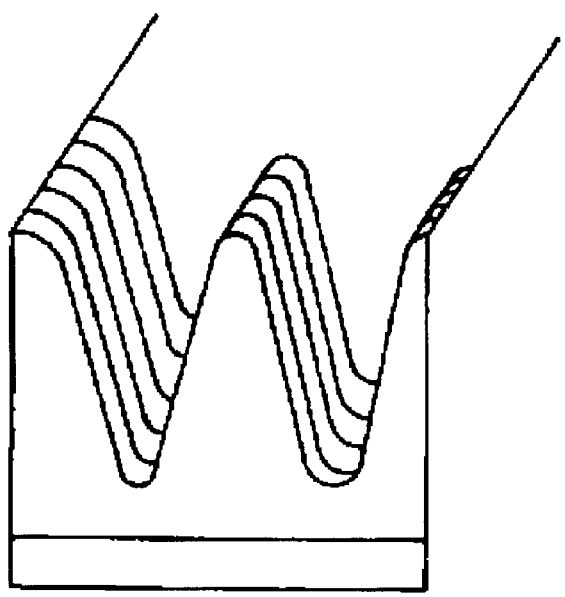
FIG. 4 is a cross-sectional view of the poor resolution shape of L & S pattern form obtained by using the resist composition wherein the polymer of the present invention is not used.

As a result, 0.15 μm L & S was resolved but fine pattern lower than it was not resolved because of deficient contrast as illustrated in FIG. 4.

Example 14

The following resist composition was prepared.

| | |
|---|---|
| Poly [styrene/p-(1-ethoxyethoxy)styrene/p-hydroxystyrene] (30:65:5) | 2.2 g |
| Triphenylsulfonium/trifluoromethanesulfonate | 0.11 g |
| Fluorine-containing nonionic surfactant (commercially available one) | 0.002 g |
| Trihexylamine | 0.01 g |
| Propylene glycol monomethyl ether acetate | 53 g |

The above ingredients were blended with one another and filtered through 0.2 μm pore size filter to give a resist composition. Using this composition, a pattern formation was conducted by the following process.

Figure 5:
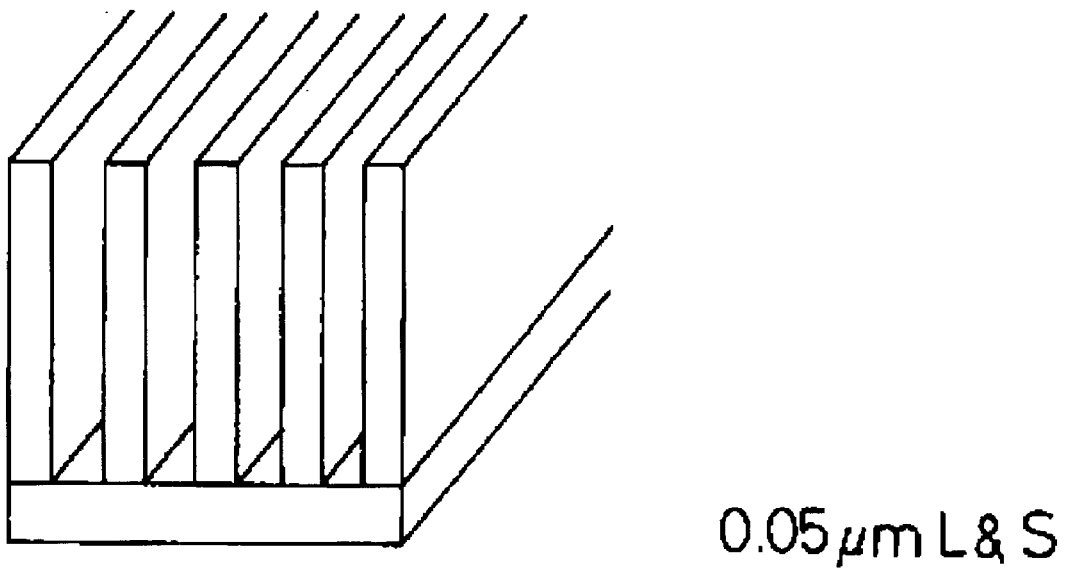
FIG. 5 is a cross-sectional view of the good shape of L & S pattern form obtained by using a resist composition wherein the polymer of the present invention is used.

A resist wherein novolac resin was used as the main resin component was spin-coated on a silicone wafer, followed by hard-baking at 200° C. for 120 seconds on a hot plate to give a resist membrane of 0.5 μm. Then, the above composition was spin-coated on the surface to form a layer of 0.1 μm, followed by baking at 90 for 90 seconds on a hot plate to give a resist membrane of 0.6 μm thick. Then, the resultant was selectively exposed using an EB exposure machine, followed by post-baking at 105° C. for 90 seconds on a hot plate. The resultant was finally allowed to contact with HMDS (hexamethyldisilazane) vapor for 3 minutes to silylate the exposed areas, and then dry development was conducted by etching using parallel flat plate type RIE. The above process gave a rectangular and perpendicular pattern of 0.05 μm L & S as illustrated in FIG. 5. Exposure dose was 8 μC/cm².

Examples 15 and 16

Resist compositions of Table 5 were prepared and a pattern formation was conducted by the same manner as Example 12.

TABLE 5

| Example 15 | Poly [p-tert-butoxystyrene/p-(1-ethoxyethoxy) Styrene/methyl methacrylate] (20:70:10) | 2.2 g |
| | Diphenyl-p-tolylsulfonium/perfluorooctane-sulfonate | 0.10 g |
| | Fluorine-containing nonionic surfactant (commercially Available one) | 0.002 g |
| | Triethanolamine | 0.01 g |
| | Propylene glycol monomethyl ether acetate | 53 g |
| Example 16 | Poly [styrene/p-(1-ethoxyethoxy)styrene/p-hydrodoxystyrene/methyl methacrylate] (5:80:5:10) | 2.2 g |
| | Trimethylsulfonium/trifluoromethanesulfonate | 0.10 g |
| | Fluorine-containing nonionic surfactant (commercially Available one) | 0.002 g |
| | Triisopropnaolamine | 0.01 g |
| | Propylene glycol monomethyl ether acetate | 53 g |

TABLE 6

| Example | Exposure dose mJ/cm² | Resolution μm L & S | Shape |
|---|---|---|---|
| 15 | 9 | 0.05 | Good |
| 16 | 8 | 0.06 | Good |

Comparative Example 3

Using poly(p-1-ethoxyethoxystyrene/p-hydroxystyrene) in place of the polymer in Example 12, the following resist composition was prepared and a pattern formation was conducted after the same manner as Example 12.

| Poly (p-1-ethoxyethoyxstyrene/p-hydroxystyrene) (30:70) | 2.2 g |
| Bis (cyclohexylsulfonyl) diazomethane | 0.15 g |
| Fluorine-containing nonionic surfactant (commercially available one) | 0.07 g |
| Tri-n-propylamine | 0.02 g |
| Proplylene glycol monomethyl ether acetate | 53 g |

Figure 6:
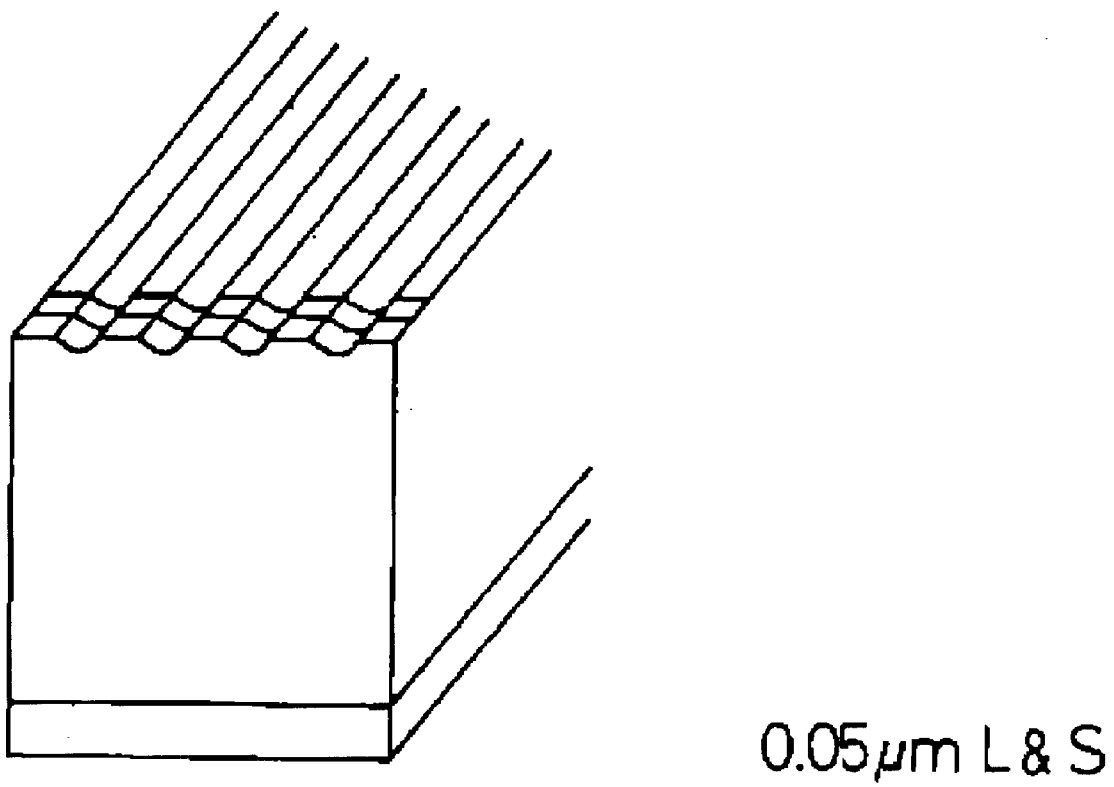
FIG. 6 is a cross-sectional view of the non-resolved shape obtained by using the resist composition wherein the polymer of the present invention is not used.

As a result, no pattern was resolved because of deficient contrast as illustrated in FIG. 6.

Example 17 and Comparative Examples 4 and 5

Using resist compositions in Table 7 prepared in place of the polymer in Example 4, a pattern formation was conducted. The result is shown in Table 8. In Table 8, the result of Example 4 is also shown.

TABLE 7

| Example 17 | Poly [p-tert-butoxystyrene/p-(1-ethoxyethoxy) styrene/p-hydroxystyrene] (35:58;:7) | 4.5 g |
| Comparative Example 4 | Poly [p-tert-butoxystyrene/p-(1-ethoxystyrene) styrene/p-hydroxystyrene] (35:53:12) | 4.5 g |
| Comparative Example 5 | Poly [p-tert-butoxystyrene/p-(1-ethoxyethoxy) styrene/p-hydroxystrene (35:35:30) | 4.5 g |

TABLE 8

| | Exposure dose mJ/cm² | Resolution μm L & S | Residue on pattern |
|---|---|---|---|
| Example 4 | 42 | 0.12 | None |
| Example 17 | 41 | 0.12 | A few residue |
| Comparative example 4 | 39 | 0.13 | Residue |
| Comparative example 5 | 35 | 0.15 | Many residue |

As clear from the result of Table 8, an amount of residue on a substrate after pattern formation becomes more as the ratio of the monomer unit originated from p-hydroxystyrene in the polymer becomes higher, and it is understood that the adjustment of the ratio to 10% or less is preferable.

The present invention provides a polymer and a resist composition useful in a silylated surface resolution process, and by conducting the silylated surface resolution process using the resist composition of the present invention, contrast of silylation becomes higher and it becomes possible to obtain ultra-fine pattern regardless of the kind of exposure energy, and thus the present invention can remarkably contribute to the production of ultra-high integrated circuits.

What is claimed is:
1. A polymer, which is shown by the following general formula (1)

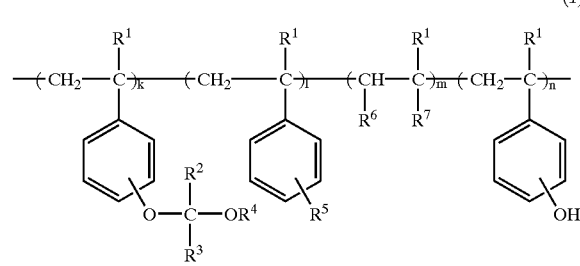

(1)

wherein $R^1$ is a hydrogen atom or a methyl group;

$R^2$ and $R^3$ are each independently a hydrogen atom or a straight chained or branched alkyl group having 1 to 6 carbon atoms but not both $R^2$ and $R^3$ are hydrogen atoms;

$R^4$ is a straight chained, branched or cyclic alkyl group having 1 to 6 carbon atoms, an aralkyl group or a phenyl group, and $R^2$ and $R^3$, $R^2$ and $R^4$ or $R^3$ and $R^4$ may form together a ring, respectively;

$R^5$ is a hydrogen atom, a straight chained, branched or cyclic alkyl group having 1 to 6 carbon atoms, a straight chained, branched or cyclic alkoxy group having 1 to 6 carbon atoms, a tert-butoxycarbonyloxy group, a tetrahydropyranyloxy group, an acetyloxy group or a group of —OCH$_2$COOC(CH$_3$)$_3$;

$R^6$ is a hydrogen atom or a cyano group;

$R^7$ is a group of —COOR$^8$ in which $R^8$ is a straight chained, branched or cyclic alkyl group having 1 to 6 carbon atoms or a bridged alicyclic hydrocarbon group having 7 to 12 carbon atoms, a cyano group or a group shown by the following general formula (8)

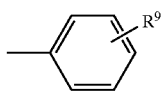
(8)

wherein $R^9$ is a hydrogen atom, a straight chained, branched or cyclic alkyl group having 1 to 6 carbon atoms or a straight chained, branched or cyclic alkoxy group having 1 to 6 carbon atoms; and $R^6$ and $R^7$ may form together a group of —CO—O—CO— or —CO—NR$^{10}$—CO—, wherein $R^1$ is a hydrogen atom, a straight chained, branched or cyclic alkyl group having 1 to 6 carbon atoms or a straight chained, branched or cyclic alkoxy group having 1 to 6 carbon atoms, k and l are positive integers, m and n are each independently 0 or a positive integer, and where $0.1 \leq k/(k+l+m+n) \leq 0.9$, $0 \leq l/(k+l+m+n) \leq 0.9$, $0 \leq m/(k+l+m+n) \leq 0.8$, and $0 \leq n/(k+l+m+n) \leq 0.1$.

2. A polymer, which is shown by the following general formula (1')

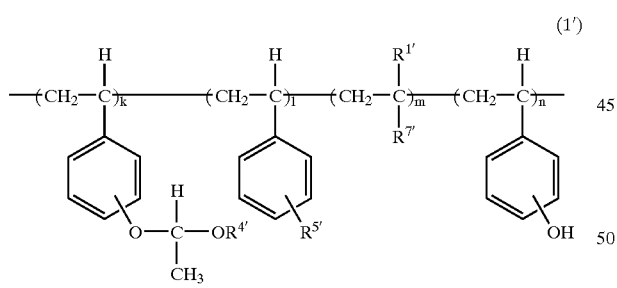
(1')

wherein $R^{4'}$ is a methyl group or an ethyl group;

$R^{5'}$ is a hydrogen atom, a t-butoxy group, a t-butoxycarbonyloxy group or a tetrahydropyranyloxy group;

$R^{1'}$ is a hydrogen atom or a methyl group;

$R^{7'}$ is a methoxycarbonyl group, a cyclohexyloxycarbonyl group or an isobornyloxycarbonyl group, k is a positive integer, l, m and n are each independently 0 or a positive integer, but l and m are not both 0, and where $0.1 \leq k/(k+l+m+n) \leq 0.9$, $0 \leq l/(k+l+m+n) \leq 0.9$, $0 \leq m/(k+l+m+n) \leq 0.8$, and $0 \leq n/(k+l+m+n) \leq 0.1$.

3. A polymer, which is shown by the following general formula (6)

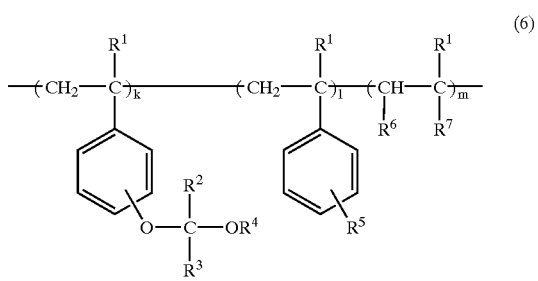
(6)

wherein $R^1$ is a hydrogen atom or a methyl group;

$R^2$ and $R^3$ are each independently a hydrogen atom or a straight chained or branched alkyl group having 1 to 6 carbon atoms, but not both $R^2$ and $R^3$ are hydrogen atoms;

$R^4$ is a straight chained, branched or cyclic alkyl group having 1 to 6 carbon atoms, an aralkyl group or a phenyl group, and $R^2$ and $R^3$, $R^2$ and $R^4$ or $R^3$ and $R^4$ may form together a ring, respectively;

$R^5$ is a hydrogen atom, a straight chained, branched or cyclic alkyl group having 1 to 6 carbon atoms, a straight chains, branched or cyclic alkoxy group having 1 to 6 carbon atoms, a tert-butoxycarbonyloxy group, a tetrahydropyranyloxy group, an acetyloxy group or a group of —OCH$_2$COOC(CH$_3$)$_3$;

$R^6$ is a hydrogen atom or a cyano group;

$R^7$ is a group of —COOR$^8$ in which $R^8$ is a straight chained, branched or cyclic alkyl group having 1 to 6 carbon atoms or a bridged alicyclic hydrocarbon group having 7 to 12 carbon atoms, a cyano group or a group shown by the following general formula (8)

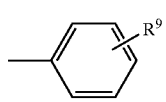
(8)

wherein $R^9$ is a hydrogen atom, a straight chained, branched or cyclic alkyl group having 1 to 6 carbon atoms or a straight chained, branched or cyclic alkoxy group having 1 to 6 carbon atoms; and $R^6$ and $R^7$ may form together a group of —CO—O—CO— or —CO—NR$^{10}$—CO—, wherein $R^{10}$ is a hydrogen atom, a straight chained, branched or cyclic alkyl group having 1 to 6 carbon atoms or a straight chained, branched or cyclic alkoxy group having 1 to 6 carbon atoms, k, l', and m' are a positive integer, and where $0.1 \leq k/(k+l'+m') \leq 0.9$, $0 \leq l'/(k+l'+m') \leq 0.9$, $0 \leq m'/(k+l'+m') \leq 0.8$.

4. A polymer, which is shown by the following general formula (6')

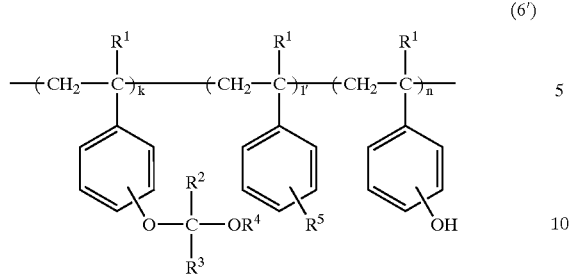

(6')

wherein $R^1$ is a hydrogen atom or a methyl group;
$R^2$ and $R^3$ are each independently a hydrogen atom or a straight chained or branched alkyl group having 1 to 6 carbon atoms, but not both $R^2$ and $R^3$ are hydrogen atoms;
$R^4$ is a straight chained, branched or cyclic alkyl group having 1 to 6 carbon atoms, an aralkyl group or a phenyl group, and $R^2$ and $R^3$, $R^2$ and $R^4$ or $R^3$ and $R^4$ may form together a ring, respectively;
$R^5$ is a hydrogen atom, a straight chained, branched or cyclic alkyl group having 1 to 6 carbon atoms, a straight chained, branched or cyclic alkoxy group having 1 to 6 carbon atoms, a tert-butoxycarbonyloxy group, a tetrahydropyranyloxy group, an acetyloxy group or a group of —$OCH_2COOC(CH_3)_3$; k and l' is a positive integer, n is 0 or a positive integer, and where $0.1 \leq k/(k+l'+n) \leq 0.9$, $0 < l'/(k+l'+n) \leq 0.9$, and $0 \leq n/(k+l'+n) \leq 0.1$.

5. A polymer according to claim 4, wherein;
$R^1$ is a hydrogen atom; $R^2$ is a hydrogen atom; $R^3$ is a methyl group; $R^4$ is a methyl group or an ethyl group; and $R^5$ is a hydrogen atom, a t-butoxy group, a t-butoxycarbonyloxy group or a tetrahydropyranyloxy group.

6. A polymer, which is shown by the general formula (6'''')

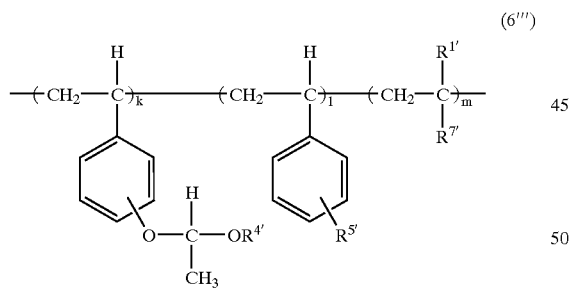

(6''')

wherein $R^{4'}$ is a methyl group or an ethyl group;
$R^{5'}$ is a hydrogen atom, a t-butoxy group, a t-butoxycarbonyloxy group or a tetrahydropyranyloxy group;
$R^{1'}$ is a hydrogen atom or a methyl group;
$R^{7'}$ is a methoxycarbonyl group, a cyclohexyloxycarbonyl group or an isobornyloxycarbonyl group, k is a positive integer, l and m are each independently 0 or a positive integer, but l and m are not both 0, and where $0.1 \leq k/(k+l+m) \leq 0.9$, $0 \leq l/(k+l+m) \leq 0.9$, and $0 \leq m/(k+l+m) \leq 0.8$.

7. A polymer, which is shown by the following general formula (7)

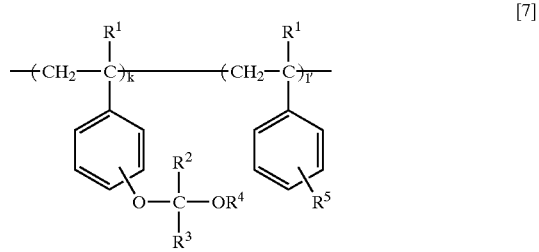

[7]

wherein $R^1$ is a hydrogen atom or a methyl group;
$R^2$ and $R^3$ are each independently a hydrogen atoms or a straight chained or branched alkyl group having 1 to 6 carbon atoms, but not both $R^2$ and $R^3$ are hydrogen atoms;
$R^4$ is a straight chained, branched or cyclic alkyl group having 1 to 6 carbon atoms, an aralkyl group or a phenyl group, and $R^2$ and $R^3$, $R^2$ and $R^4$ or $R^3$ and $R^4$ may form together a ring, respectively;
$R^5$ is a hydrogen atom, a straight chained, branched or cyclic alkyl group having 1 to 6 carbon atoms, a straight chained, branched or cyclic alkoxy group having 1 to 6 carbon atoms, a tert-butoxycarbonyloxy group, a tetrahydropyranyloxy group, an acetyloxy group or a group of —$OCH_2COOC(CH_3)_3$; k and l' are positive integers, and where $0.1 \leq k/(k+l') \leq 0.9$.

8. A polymer according to claim 7, wherein;
$R^1$ is a hydrogen atom; $R^2$ is a hydrogen atom; $R^3$ is a methyl group; $R^4$ is a methyl group or an ethyl group; and $R^5$ is a hydrogen atom, a t-butoxy group, a t-butoxycarbonyloxy group or a tetrahydropyranyloxy group.

9. A polymer, which is shown by the general formula (17')

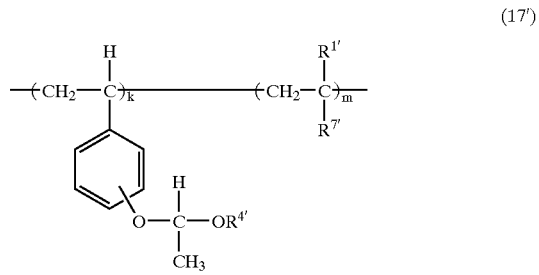

(17')

wherein $R^{4'}$ is a methyl group or an ethyl group;
$R^{1'}$ is a hydrogen atom or a methyl group;
$R^{7'}$ is a methoxycarbonyl group, a cyclohexyloxycarbonyl group or an isobornyloxycarbonyl group, k and m' are positive integers, and where $0.2 \leq k/(k+m') \leq 0.9$ and $0.1 \leq m'/(k+m') \leq 0.8$.

10. A polymer for a resist composition, wherein the polymer claimed in any of the claims 1 to 4, 5 to 7, 9 and 8 is contained therein.

11. A resist composition comprising the polymer claimed in any of the claims 1 to 4, 5 to 7, 9 and 8.

12. A resist composition for a process for resolution of silylated surface comprising the resist composition claimed in the claim 11.

13. A resist composition comprising;
a polymer shown by the following general formula (1) below;
a compound capable of generating an acid by irradiation with actinic radiation; and a solvent capable of dissolving said polymer and said compound;

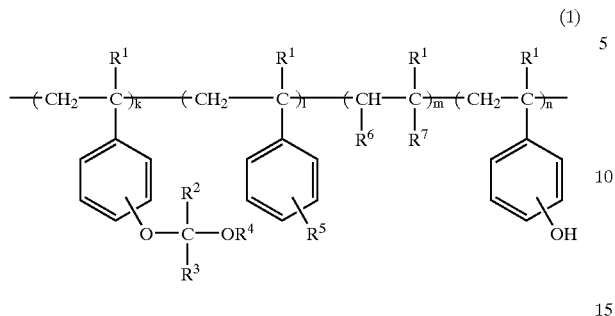

(1)

wherein $R^1$ is a hydrogen atom or a methyl group;

$R^2$ and $R^3$ are each independently a hydrogen atom or a straight chained or branched alkyl group having 1 to 6 carbon atoms, but not both $R^2$ and $R^3$ are hydrogen atoms;

$R^4$ is a straight chained, branched or cyclic alkyl group having 1 to 6 carbon atoms, an aralkyl group or a phenyl group, and $R^2$ and $R^3$, $R^2$ and $R^4$ or $R^3$ and $R^4$ may form together a ring, respectively;

$R^5$ is a hydrogen atom, a straight chained, branched or cyclic alkyl group having 1 to 6 carbon atoms, a straight chained, branched or cyclic alkoxy group having 1 to 6 carbon atoms, a tert-butoxycarbonyloxy group, a tetrahydropyranyloxy group, an acetyloxy group or a group of —$OCH_2COOC(CH_3)_3$;

$R^6$ is a hydrogen atom or a cyano group;

$R^7$ is a group of —$COOR^8$ in which $R^8$ is a straight chained, branched or cyclic alkyl group having 1 to 6 carbon atoms or a bridged alicyclic hydrocarbon group having 7 to 12 carbon atoms, a cyano group or a group shown by the following general formula (8)

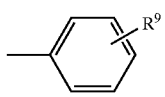

(8)

wherein $R^9$ is a hydrogen atom, a straight chained, branched or cyclic alkyl group having 1 to 6 carbon atoms or a straight chained, branched or cyclic alkoxy group having 1 to 6 carbon atoms, and $R^6$ and $R^7$ may form together a group of —CO—O—CO— or —CO—$NR^{10}$—CO—, wherein $R^{10}$ is a hydrogen atom, a straight chained, branched or cyclic alkoxy group having 1 to 6 carbon atoms or a straight chained, branched or cyclic alkoxy group having 1 to 6 carbon atoms, k, and 1 are a positive integer, m and n are each independently 0 or a positive integer, and where $0.1 \leq k/(k+l+m+n) \leq 0.9$, $0 \leq l/(k+l+m+n) \leq 0.9$, $0 \leq m/(k+l+m+n) \leq 0.8$, and $0 \leq n/(k+l+m+n) \leq 0.1$.

14. A resist composition comprising;

a polymer shown by the following general formula (6) below;

a compound capable of generating an acid by irradiation with actinic radiation; and a solvent capable of dissolving said polymer and said compound;

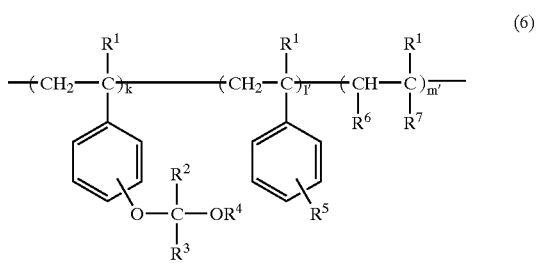

(6)

wherein $R^1$ is a hydrogen atom or a methyl group;

$R^2$ and $R^3$ are each independently a hydrogen atom or a straight chained or branched alkyl group having 1 to 6 carbon atoms, but not both $R^2$ and $R^3$ are hydrogen atoms;

$R^4$ is a straight chained, branched or cyclic alkyl group having 1 to 6 carbon atoms, an aralkyl group or a phenyl group, and $R^2$ and $R^3$, $R^2$ and $R^4$ or $R^3$ and $R^4$ may form together a ring, respectively;

$R^5$ is a hydrogen atom, a straight chained, or branched or cyclic alkyl group having 1 to 6 carbon atoms, a straight chained, branched or cyclic alkoxy group having 1 to 6 carbon atoms, a tert-butoxycarbonyloxy group, a tetrahydropyranyloxy group, an acetyloxy group or a group of —$OCH_2COOC(CH_3)_3$;

$R^6$ is a hydrogen atom or a cyano group;

$R^7$ is a group of —$COOR^8$ in which $R^8$ is a straight chained, branched or cyclic alkyl group having 1 to 6 carbon atoms or a bridged alicyclic hydrocarbon group having 7 to 12 carbon atoms, a cyano group or a group shown by the following general formula (8)

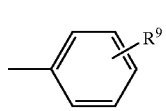

(8)

wherein $R^9$ is a hydrogen atom, a straight chained, branched or cyclic alkyl group having 1 to 6 carbon atoms or a straight chained, branched or cyclic alkoxy group having 1 to 6 carbon atoms; and $R^6$ and $R^7$ may form together a group of —CO—O—CO— or —CO—$NR^{10}$—CO, wherein $R^{10}$ is a hydrogen atom, a straight chained, branched or cyclic alkyl group having 1 to 6 carbon atoms or a straight chained, branched or cyclic alkoxy group having 1 to 6 carbon atoms, k, l' and m' are a positive integer, and where $0.1 \leq k/(k+l'+m') \leq 0.9$, $0 \leq l'/(k+l'+m') \leq 0.9$, and $0 \leq m'/(k+l'+m') \leq 0.8$.

15. A resist composition comprising;

a polymer shown by the following general formula (6') below;

a compound capable of generating an acid by irradiation with actinic radiation; and a solvent capable of dissolving said polymer and said compound;

(6')

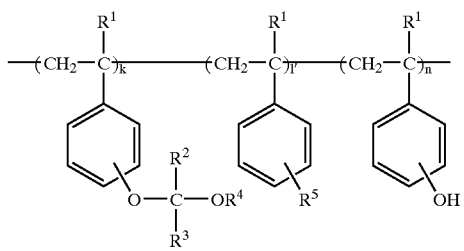

wherein $R^1$ is a hydrogen atom or a methyl group;

$R^2$ and $R^3$ are each independently a hydrogen atom or a straight chained or branched alkyl group having 1 to 6 carbon atoms, but not both $R^2$ and $R^3$ are hydrogen atoms;

$R^4$ is a straight chained, branched or cyclic alkyl group having 1 to 6 carbon atoms, an aralkyl group or a phenyl group, and $R^2$ and $R^3$, $R^2$ and $R^4$ or $R^3$ and $R^4$ may form together a ring, respectively;

$R^5$ is a hydrogen atom, a straight chained, branched or cyclic alkyl group having 1 to 6 carbon atoms, a straight chained, branched or cyclic alkoxy group having 1 to 6 carbon atoms, a tert-butoxycarbonyloxy group, a tetrahydropyranyloxy group, an acetyloxy group or a group of —OCH$_2$COOC(CH$_3$)$_3$; k and l' is a positive integer, n is 0 or a positive integer, and where $0.1 \leq k/(k+l'+n) \leq 0.9$, $0 \leq l'/(k+l'+n) \leq 0.9$, and $0 \leq n/(k+l'+n) \leq 0.1$.

16. A resist composition comprising;

a polymer shown by the following general formula (7) below;

a compound capable of generating an acid by irradiation with actinic radiation; and a solvent capable of dissolving said polymer and said compound;

(7)

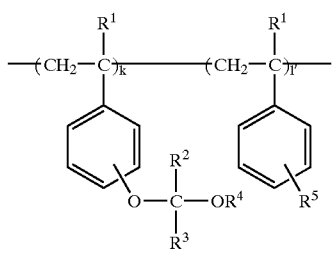

wherein $R^1$ is a hydrogen atom or a methyl group;

$R^2$ and $R^3$ are each independently a hydrogen atom or a straight chained or branched alkyl group having 1 to 6 carbon atoms, but not both $R^2$ and $R^3$ are hydrogen atoms;

$R^4$ is a straight chained, branched or cyclic alkyl group having 1 to 6 carbon atoms, an aralkyl group or a phenyl group, and $R^2$ and $R^3$, $R^2$ and $R^4$ or $R^3$ and $R^4$ may form together a ring, respectively;

$R^5$ is a hydrogen atom, a straight chained, branched or cyclic alkyl group having 1 to 6 carbon atoms, a straight chained, branched or cyclic alkoxy group having 1 to 6 carbon atoms, a tert-butoxycarbonyloxy group, a tetrahydropyranyloxy group, an acetyloxy group or a group of —OCH$_2$COOC(CH$_3$)$_3$; k and l' are a positive integer, and where $0.1 \leq k/(k+l') \leq 0.9$.

17. A resist composition comprising;

a polymer shown by the following general formula (17) below;

a compound capable of generating an acid by irradiation with actinic radiation; and a solvent capable of dissolving said polymer and said compound;

(17)

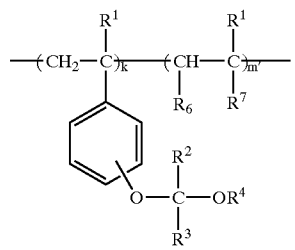

wherein $R^1$ is a hydrogen atom or a methyl group;

$R^2$ and $R^3$ are each independently a hydrogen atom or a straight chained or branched alkyl group having 1 to 6 carbon atoms, but not both $R^2$ and $R^3$ are hydrogen atoms;

$R^4$ is a straight chained, branched or cyclic alkyl group having 1 to 6 carbon atoms, an aralkyl group or a phenyl group, and $R^2$ and $R^3$, $R^2$ and $R^4$ or $R^3$ and $R^4$ may form together a ring, respectively;

$R^6$ is a hydrogen atom or a cyano group;

$R^7$ is a group of —COOR$^8$ in which $R^8$ is a straight chained, branched or cyclic alkyl group having 1 to 6 carbon atoms or a bridged clicyclic hydrocarbon group having 7 to 12 carbon atoms, a cyano group or a group shown by the following general formula (8)

(8)

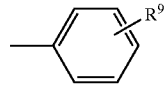

wherein $R^9$ is a hydrogen atom, a straight chained, branched or cyclic alkyl group having 1 to 6 carbon atoms or a straight chained, branched or cyclic alkoxy group having 1 to 6 carbon atoms; and $R^6$ and $R^7$ may form together a group of —CO—O—CO— or —CO—NR$^{10}$—CO—, wherein $R^{10}$ is a hydrogen atom, a straight chained, branched or cyclic alkyl group having 1 to 6 carbon atoms or a straight chained, branched or cyclic alkoxy group having 1 to 6 carbon atoms, k and m are a positive integer, and where $0.2 \leq k/(k+m') \leq 0.9$ and $0.1 \leq m'/(k+m') \leq 0.8$.

18. A resist composition for a process for resolution of silylated surface comprising the resist composition claimed in any of the claims 13 to 17.

19. A polymer, which is shown by the following general formula (1)

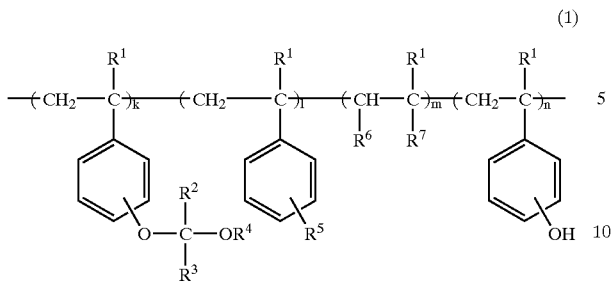

wherein $R^1$ is a hydrogen atom or a methyl group;

$R^2$ and $R^3$ are each independently a hydrogen atom or a straight chained or branched alkyl group having 1 to 6 carbon atoms, but not both $R^2$ and $R^3$ are hydrogen atoms;

$R^4$ is a straight chained, branched or cyclic alkyl group having 1 to 6 carbon atoms, an aralkyl group or a phenyl group, and $R^2$ and $R^3$, $R^2$ and $R^4$ or $R^3$ and $R^4$ may form together a ring, respectively;

$R^5$ is a hydrogen atom, a straight chained, branched or cyclic alkyl group having 1 to 6 carbon atoms, a straight chained, branched or cyclic alkoxy group having 1 to 6 carbon atoms, a tert-butoxycarbonyloxy group, a tetrahydropyranyloxy group, an acetyloxy group or a group of $-OCH_2COOC(CH_3)_3$;

$R^6$ is a hydrogen atom or a cyano group;

$R^7$ is a group of $-COOR^8$ in which $R^8$ is a straight chained, branched or cyclic alkyl group having 1 to 6 carbon atoms or a bridged alicyclic hydrocarbon group having 7 to 12 carbon atoms, a cyano group or a group shown by the following general formula (8)

wherein $R^9$ is a hydrogen atom, a straight chained, branched or cyclic alkyl group having 1 to 6 carbon atoms or a straight chained, branched or cyclic alkoxy group having 1 to 6 carbon atoms; and $R^6$ and $R^7$ may form together a group of $-CO-O-CO-$ or $-CO-NR^{10}-CO-$, wherein $R^{10}$ is a hydrogen atom, a straight chained, branched or cyclic alkoxy group having 1 to 6 carbon atoms or a straight chained, branched or cyclic alkoxy group having 1 to 6 carbon atoms;

and wherein k, l, m and n are each positive integers, and $0.1 \leq k/(k+l+m+n) \leq 0.9$, $0 \leq l/(k+l+m+n) \leq 0.9$, $0 \leq m/(k+l+m+n) \leq 0.8$ and $0 \leq n/(k+l+m+n) \leq 0.1$.

20. A polymer for a resist composition, wherein the polymer claimed in the claim 19 is contained therein.

21. A resist composition comprising the polymer claimed in the claim 19.

22. A resist composition for a process for a resolution of silylated surface comprising the resist composition claimed in the claim 21.

23. A resist composition comprising the polymer of claim 1 or 19, and further comprising:

a compound capable of generating an acid by irradiation with actinic irradiation; and a solvent capable of dissolving said polymer and said compound.

* * * * *